US012557524B2

(12) United States Patent
Song et al.

(10) Patent No.: US 12,557,524 B2

(45) Date of Patent: Feb. 17, 2026

(54) DISPLAY APPARATUS

(71) Applicant: SAMSUNG DISPLAY CO., LTD., Yongin-si (KR)

(72) Inventors: Kicheol Song, Yongin-si (KR); Younjoeng Goh, Yongin-si (KR); Hongkwan Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 503 days.

(21) Appl. No.: 18/152,265

(22) Filed: Jan. 10, 2023

(65) Prior Publication Data

US 2023/0389395 A1 Nov. 30, 2023

(30) Foreign Application Priority Data

May 31, 2022 (KR) ........................ 10-2022-0066913

(51) Int. Cl.

*H10K 59/80* (2023.01)
*G09G 3/00* (2006.01)
*G09G 3/3233* (2016.01)

(52) U.S. Cl.

CPC ........... *H10K 59/871* (2023.02); *G09G 3/035* (2020.08); *G09G 3/3233* (2013.01); *G09G 2300/0426* (2013.01); *G09G 2300/0842* (2013.01); *G09G 2354/00* (2013.01)

(58) Field of Classification Search

CPC .... H10K 59/871; G09G 3/035; G09G 3/3233; G09G 2300/0426; G09G 2300/0842; G09G 2354/00

See application file for complete search history.

(56) References Cited

U.S. PATENT DOCUMENTS

| | | | | |
|---|---|---|---|---|
| 2018/0374399 | A1* | 12/2018 | Han | G09F 9/301 |
| 2019/0357366 | A1 | 11/2019 | Choi et al. | |
| 2020/0411780 | A1* | 12/2020 | Kim | H10K 50/841 |
| 2021/0150945 | A1* | 5/2021 | Youn | G06F 1/1609 |
| 2022/0244761 | A1 | 8/2022 | Kim et al. | |

FOREIGN PATENT DOCUMENTS

| | | | |
|---|---|---|---|
| KR | 1020180021299 | A | 3/2018 |
| KR | 1020180047609 | A | 5/2018 |
| KR | 1020190066106 | A | 6/2019 |
| KR | 1020190132604 | A | 11/2019 |
| KR | 1020190137433 | A | 12/2019 |
| KR | 1020200052643 | A | 5/2020 |

* cited by examiner

*Primary Examiner* — Mary Ellen Bowman

(74) *Attorney, Agent, or Firm* — CANTOR COLBURN LLP

(57) ABSTRACT

A display apparatus includes: a display panel including a display element; a first plate arranged below the display panel; and a cushion layer arranged below the first plate, where the cushion layer has a storage modulus in a range of about 0.1 MPa to about 10.0 MPa and a tangent delta in a range of about 0.1 to about 0.5, at a temperature of 25° C. and a frequency of 1 Hz.

20 Claims, 12 Drawing Sheets

DISPLAY APPARATUS

This application claims priority to Korean Patent Application No. 10-2022-0066913, filed on May 31, 2022, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus with improved impact resistance.

2. Description of the Related Art

Recently, display apparatuses are widely used in various fields. Display panels included in such display apparatuses are desired to be more lightweight and thinner, but the intensity of display panels decreases as display panels are made lighter and thinner. In such display apparatuses, cushion layers for absorbing external impacts applied to display apparatuses may be arranged below display panels.

SUMMARY

In general display apparatuses, properties of cushion layers affect degrees to which the cushion layers are able to absorb external impacts applied to the display apparatuses.

One or more embodiments include a display apparatus in which impact resistance is improved.

According to one or more embodiments, a display apparatus includes a display panel including a display element, a first plate arranged below the display panel, and a cushion layer arranged below the first plate, wherein the cushion layer has a storage modulus in a range of about 0.1 megapascal (MPa) to about 10.0 MPa and a tangent delta in a range of about 0.1 to about 0.5, at a temperature of 25° C. and a frequency of 1 hertz (Hz).

In an embodiment, the cushion layer may have a loss modulus in a range of about 0.1 MPa to about 5.0 MPa at the temperature of 25° C. and the frequency of 1 Hz.

In an embodiment, the cushion layer may have a storage modulus in a range of about 10.0 MPa to about 400.0 MPa at a temperature of −20° C. and the frequency of 1 Hz.

In an embodiment, the cushion layer may have a tangent delta in a range of about 0.1 to about 0.5 at the temperature of −20° C. and the frequency of 1 Hz.

In an embodiment, the cushion layer may have a loss modulus in a range of about 5.0 MPa to about 80.0 MPa at the temperature of −20° C. and the frequency of 1 Hz.

In an embodiment, the cushion layer may have a storage modulus in a range of about 0.5 MPa to about 5.0 MPa at a temperature of about 60° C. and the frequency of about 1 Hz.

In an embodiment, the cushion layer may have a tangent delta in a range of about 0.1 to about 0.4 at the temperature of 60° C. and the frequency of 1 Hz.

In an embodiment, the cushion layer may have a loss modulus in a range of about 0.1 MPa to about 0.5 MPa at the temperature of 60° C. and the frequency of 1 Hz.

In an embodiment, the cushion layer may have a storage modulus in a range of about 10.0 MPa to about 50.0 MPa at the temperature of 25° C. and a frequency of 500 Hz.

In an embodiment, the cushion layer may have a tangent delta in a range of about 0.1 to about 0.5 at the temperature of 25° C. and the frequency of 500 Hz.

In an embodiment, the cushion layer may have a loss modulus in a range of about 1.0 MPa to about 10.0 MPa at the temperature of 25° C. and the frequency of 500 Hz.

In an embodiment, the cushion layer may have a storage modulus in a range of about 10.0 MPa to about 50.0 MPa at the temperature of 25° C. and a frequency of 1000 Hz.

In an embodiment, the cushion layer may have a tangent delta in a range of about 0.1 to about 0.5 at the temperature of 25° C. and the frequency of 1000 Hz.

In an embodiment, the cushion layer may have a loss modulus in a range of about 3.0 MPa to about 20.0 MPa at the temperature of 25° C. and the frequency of 1000 Hz.

In an embodiment, the cushion layer may have a storage modulus in a range of about 20.0 MPa to about 80.0 MPa at the temperature of 25° C. and a frequency of 2500 Hz.

In an embodiment, the cushion layer may have a tangent delta in a range of about 0.1 to about 0.45 at the temperature of 25° C. and the frequency of 2500 Hz.

In an embodiment, the cushion layer may have a loss modulus in a range of about 3.0 MPa to about 25.0 MPa at the temperature of 25° C. and the frequency of 2500 Hz.

In an embodiment, the cushion layer may include polyurethane or polyacrylate.

In an embodiment, the first plate may include at least one of metal, glass, and plastic.

In an embodiment, the display apparatus may further include a cover window disposed on the display panel, a first protective layer disposed between the cover window and the display panel, a second protective layer disposed below the display panel, a support layer disposed between the second protective layer and the first plate, and a second plate disposed between the first plate and the cushion layer.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
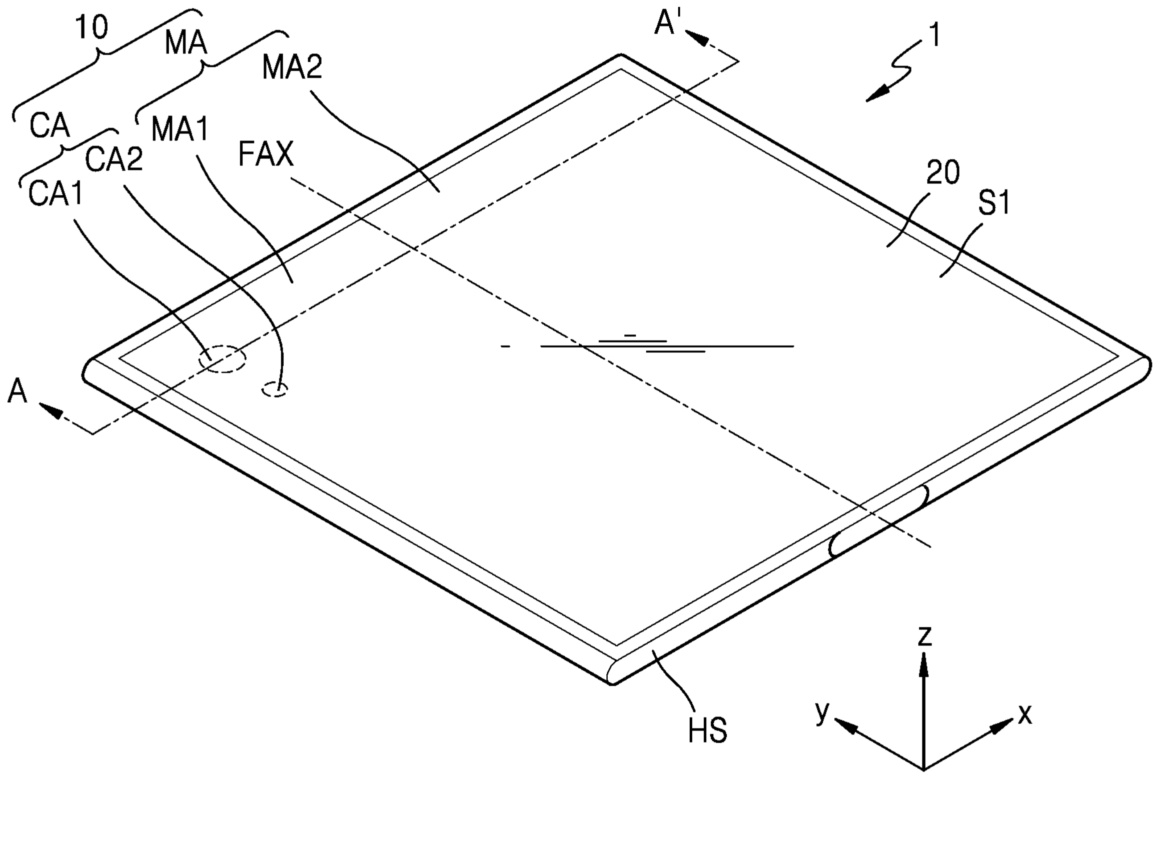
FIGS. 1 and 2 are perspective views of a display apparatus, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or component is referred to as being "on," another layer, region, or component, it can be directly or indirectly formed on the other layer, region, or component. That is, for example, intervening layers, regions, or components may be present. Sizes of elements in the drawings may be exaggerated for convenience of explanation. In other words, because sizes and thicknesses of components in the drawings are arbitrarily illustrated for convenience of explanation, the disclosure is not necessarily limited thereto.

According to embodiments, an x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings, and in the following description with reference to the drawings, like reference numerals refer to like elements and any repetitive detailed descriptions thereof may be omitted or simplified.

Figure 2:
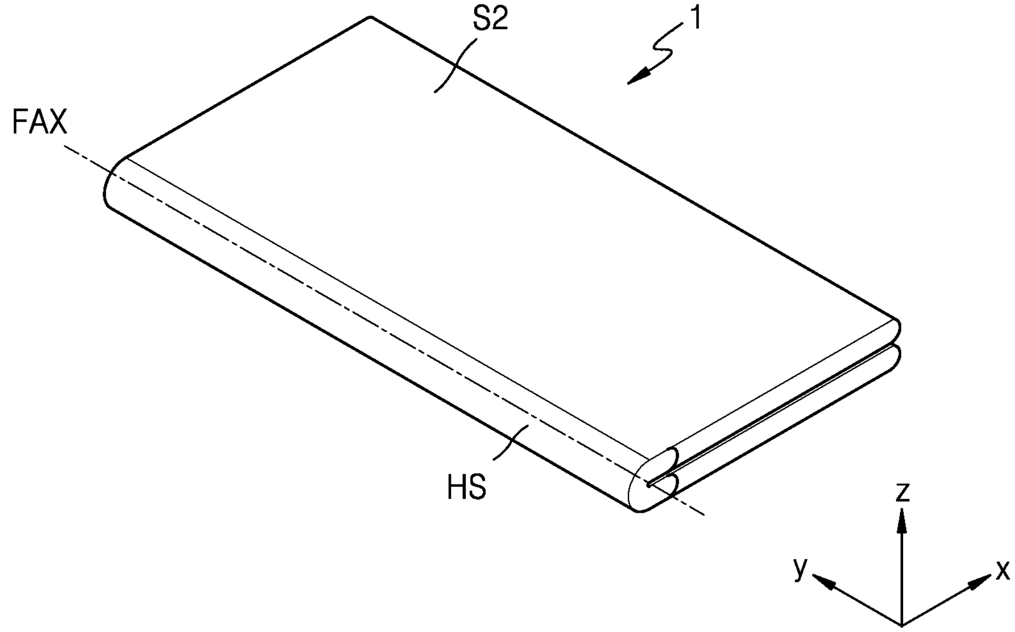

FIGS. 1 and 2 are perspective views of a display apparatus 1, according to an embodiment. In detail, FIG. 1 is a perspective view of the display apparatus 1 in an unfolded state, and FIG. 2 is a perspective view of the display apparatus 1 in a folded state.

As shown in FIGS. 1 and 2, an embodiment of the display apparatus 1 may include a housing HS, a display panel 10, and a cover window 20. The housing HS may include an inner surface defining an accommodating space. The housing HS may include a material having relatively high rigidity. In an embodiment, for example, the housing HS may include glass, plastic, or metal, or may include a plurality of frames and/or plates including a combination thereof. The housing HS may stably protect components of the display apparatus 1 accommodated in an internal space thereof from an external impact.

The display panel 10 may display an image. The display panel 10 may include a main area MA and a component area CA. According to an embodiment, the main area MA may be a main display area. A plurality of display elements may be arranged in the main area MA, and the plurality of display elements may emit light. Accordingly, the display panel 10 may display an image through light emitted from the plurality of display elements. According to an embodiment, the display element may be an organic light-emitting diode including an organic emission layer. Alternatively, the display element may be a light-emitting diode (LED). A size of the LED may be in micro-scale or nano-scale. In an embodiment, for example, the LED may be a micro LED. Alternatively, the LED may be a nanorod LED. The nanorod LED may include gallium nitride (GaN). According to an embodiment, a color conversion layer may be disposed on the nanorod LED. The color conversion layer may include quantum dots. Alternatively, the display element may be a quantum dot LED including a quantum dot emission layer. Alternatively, the display element may be an inorganic LED including an inorganic semiconductor.

The component area CA is an area where an image is displayed, and may be an area overlapping with components for adding various functions. The plurality of display elements may be arranged in the component area CA. The component area CA may be at least partially surrounded by the main area MA. According to an embodiment, the component area CA may be entirely surrounded by the main area MA. According to an embodiment, the component area CA may include a first component area CA1 and a second component area CA2. According to some embodiments, one of the first component area CA1 and the second component area CA2 may be omitted.

The cover window 20 may protect the display panel 10. According to an embodiment, the cover window 20 and the housing HS may be combined with each other to configure an exterior of the display apparatus 1. The cover window 20 may include an insulating panel. In an embodiment, for example, the cover window 20 may include glass, plastic, or a combination thereof. The cover window 20 may define a front surface of the display apparatus 1.

The cover window 20 may include an optically transparent area. Accordingly, the display panel 10 may display an image through a transparent area of the cover window 20, which is optically transparent. According to an embodiment, the transparent area may be surrounded by a bezel area, and a shape of the transparent area may be defined by the bezel area. Light transmittance of the bezel area may be lower than light transmittance of the transparent area. According to an embodiment, the bezel area may include an opaque material that blocks light. According to an embodiment, the bezel area may have a certain color. The bezel area may be defined by a bezel layer that is provided separately from a transparent substrate defining the transparent area or may be defined by an ink layer formed by being inserted into or colored on the transparent substrate.

As shown in FIGS. 1 and 2, an embodiment of the display apparatus 1 may include a first surface S1 and a second surface S2 opposite to the first surface S1. The display apparatus 1 may display an image on the first surface S1. According to an embodiment, the first surface S1 may be a front surface of the display apparatus 1. The second surface S2 may be a rear surface of the display apparatus 1. According to some embodiments, the display apparatus 1 may also display an image on the second surface S2.

The display apparatus 1 may be folded based on a folding axis FAX crossing the first surface S1. According to an embodiment, the display apparatus 1 may be folded in a way such that a part of the first surface S1 and another part of the first surface S1 face each other. According to an alternative embodiment, the display apparatus 1 may be folded in a way such that a part of the second surface S2 and another part of the second surface S2 face each other.

According to an embodiment, the folding axis FAX may extend in a first direction. According to another embodiment, the folding axis FAX may extend in a second direction crossing the first direction. According to an embodiment, the first direction and the second direction may form an acute angle. According to an embodiment, the first direction and the second direction may form a right angle or an obtuse angle. Hereinafter, embodiments where the first direction (for example, an x-direction or −x-direction) and the second direction (for example, a y-direction or −y-direction) are orthogonal will be described in detail.

An embodiment with a single folding axis FAX is shown in FIGS. 1 and 2, but according to an alternative embodiment, the display apparatus 1 may include a plurality of folding axes FAX. In an embodiment, the folding axis FAX extends in the second direction (for example, the y-direction or −y-direction) as shown in FIGS. 1 and 2, but according to an alternative embodiment, the folding axis FAX may extend in the first direction (for example, the x-direction or −x-direction) or in a direction in which the first direction (for example, the x-direction or −x-direction) and the second direction (for example, the y-direction or −y-direction) cross each other.

The display apparatus 1 may include the housing HS, the display panel 10, and the cover window 20. The display panel 10 may include the main area MA and the component area CA. According to an embodiment, the main area MA may include a first main area MA1 and a second main area MA2 with the folding axis FAX therebetween. The component area CA may be at least partially surrounded by the main area MA. The component area CA may include the first component area CA1 and the second component area CA2. In an embodiment, the component area CA is surrounded by the first main area MA1 as shown in FIG. 1, but according to an alternative embodiment, the component area CA may be surrounded by the second main area MA2.

Figure 3:
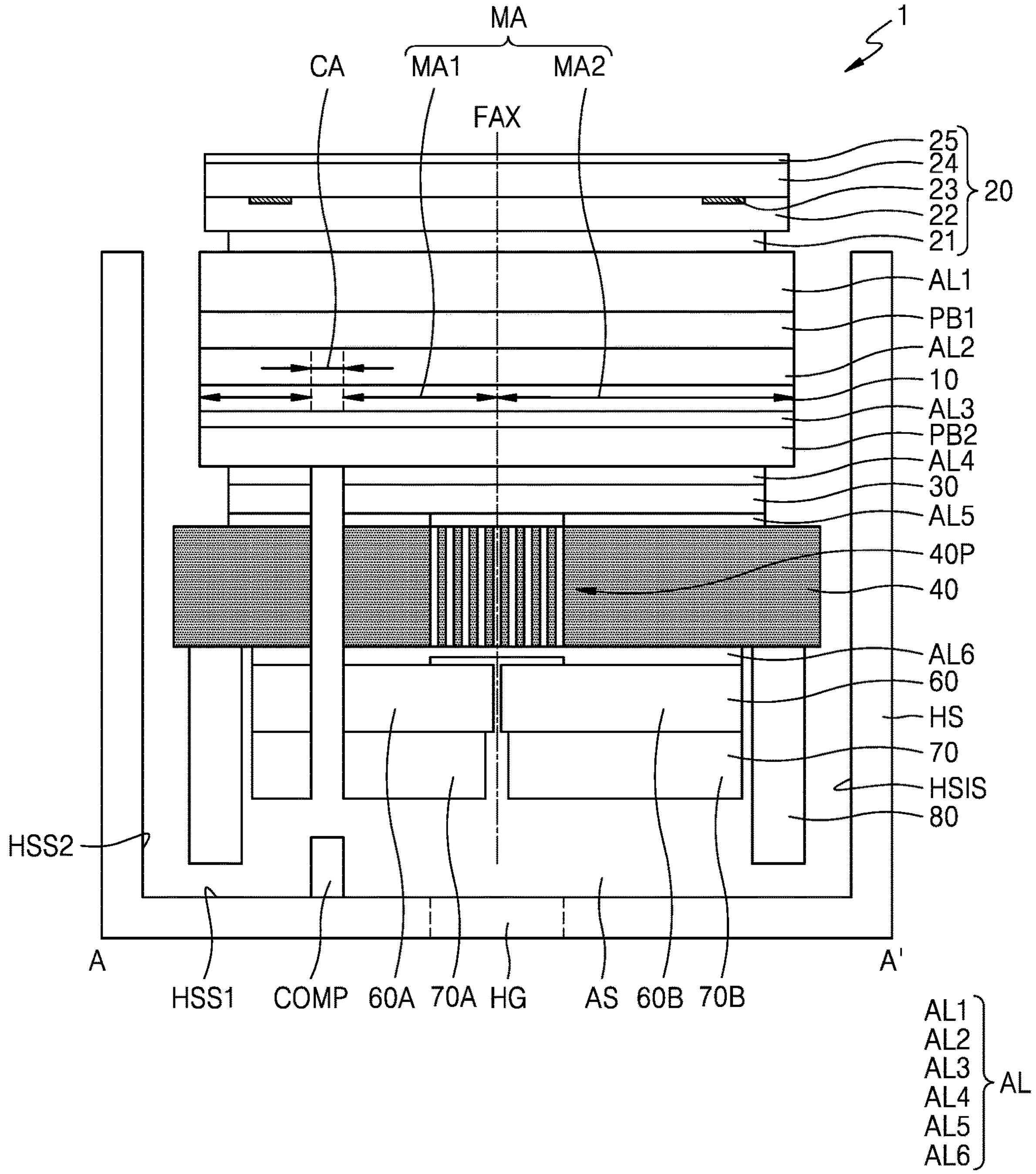
FIG. 3 is a cross-sectional view of the display apparatus of FIG. 1 taken along line A-A' of FIG. 1.

FIG. 3 is a cross-sectional view of the display apparatus 1 taken along line A-A' of FIG. 1.

Referring to FIG. 3, an embodiment of the display apparatus 1 may include the housing HS, the display panel 10, the cover window 20, a first protective layer PB1, a second protective layer PB2, a support layer 30, a first plate 40, a second plate 60, a cushion layer 70, a waterproof layer 80, an adhesive layer AL, and a component COMP.

The housing HS may include an inner surface HSIS defining an accommodating space AS. The inner surface HSIS of the housing HS may not be a surface configuring the exterior of the display apparatus 1. According to an embodiment, the housing HS may include a rear surface HSS1 and a side surface HSS2. The rear surface HSS1 and side surface HSS2 may not be surfaces configuring the exterior of the display apparatus 1. The display panel 10, first protective layer PB1, second protective layer PB2, support layer 30, first plate 40, second plate 60, cushion layer 70, waterproof layer 80, adhesive layer AL, and component COMP may face the inner surface HSIS of the housing HS.

Components of the display apparatus 1 may be arranged (positioned or disposed) in the accommodating space AS. According to an embodiment, the display panel 10, cover window 20, first protective layer PB1, second protective layer PB2, support layer 30, first plate 40, second plate 60, cushion layer 70, waterproof layer 80, adhesive layer AL, and component COMP may be arranged in the accommodating space AS. According to an embodiment, the housing HS may include a hinge area HG overlapping the folding axis FAX. Accordingly, the housing HS may be folded at the hinge area HG based on the folding axis FAX.

The display panel 10 may be arranged below the cover window 20. According to an embodiment, the display panel 10 may be arranged in the accommodating space AS. Accordingly, the housing HS may protect the display panel 10. The display panel 10 may include the main area MA and the component area CA. According to an embodiment, the component area CA may overlap the component COMP. According to an embodiment, the main area MA may include the first main area MA1 and the second main area MA2 with the folding axis FAX therebetween.

The cover window 20 may be disposed on the display panel 10. According to an embodiment, the cover window 20 may be arranged above the housing HS. Although not illustrated, according to an embodiment, the cover window 20 may be connected to the housing HS. The cover window 20 may include a window 21, a window adhesive layer 22, an opaque layer 23, a window protective layer 24, and a hard coating layer 25. According to an embodiment, the window 21 may include ultra-thin glass. According to an alternative embodiment, the window 21 may include polymer resin.

The window protective layer 24 may protect the window 21 and prevent or reduce a scratch on a top surface of the window 21. The window protective layer 24 may be disposed on the window 21. According to an embodiment, the window protective layer 24 may include polymer resin. According to an alternative embodiment, the window protective layer 24 may include an inorganic material.

The window adhesive layer 22 may be arranged between the window protective layer 24 and the window 21. The window adhesive layer 22 may adhere the window protective layer 24 and the window 21 to each other. According to an embodiment, the window adhesive layer 22 may be a pressure sensitive adhesive. According to an alternative embodiment, the window adhesive layer 22 may be an optically clear adhesive.

The opaque layer 23 may be arranged between the window adhesive layer 22 and the window protective layer 24. According to some embodiments, the opaque layer 23 may be a part of the window protective layer 24. The opaque layer 23 may include an opaque material so that wires or circuits of the display panel 10 are not viewed from or exposed to the outside. Accordingly, the opaque layer 23 may be the bezel area of the cover window 20.

The hard coating layer 25 may be disposed on the window protective layer 24. The hard coating layer 25 may be an outermost layer of the cover window 20. The hard coating layer 25 may be an outermost layer of the display apparatus 1. The hard coating layer 25 may is a layer directly touched by a user and may provide a smooth and soft touch. According to an embodiment, the hard coating layer 25 may include polymer resin. According to an alternative embodiment, the hard coating layer 25 may include an inorganic material.

The first protective layer PB1 may be arranged between the display panel 10 and the cover window 20. The first protective layer PB1 may protect the display panel 10 from an external impact. According to an embodiment, the first protective layer PB1 may include polymer resin. In an embodiment, for example, the first protective layer PB1 may include at least one selected from polyethersulfone, polyacrylate, polyetherimide, polyethylene naphthalate, polyethylene terephthalate, polyphenylene sulfide, polyimide, polycarbonate, and cellulose acetate propionate. According to an alternative embodiment, the first protective layer PB1 may include a material such as glass or quartz.

The second protective layer PB2 may be arranged below the display panel 10. According to an embodiment, the display panel 10 may be arranged between the first protective layer PB1 and the second protective layer PB2. The second protective layer PB2 may protect the display panel 10 from an external impact. According to an embodiment, the second protective layer PB2 may include a polymer material. According to an alternative embodiment, the second protective layer PB2 may include an inorganic material.

The support layer 30 may be arranged below the second protective layer PB2. According to an embodiment, the second protective layer PB2 may be arranged between the display panel 10 and the support layer 30. The support layer 30 may be arranged below the display panel 10 to support the display panel 10. The support layer 30 may include a polymer material.

The first plate 40 may be arranged below the support layer 30. According to an embodiment, the support layer 30 may be arranged between the second protective layer PB2 and the first plate 40. The first plate 40 may be arranged below the support layer 30 to support the display panel 10. Accordingly, a degree to which a center portion of the display panel 10 is sagged in a −z-direction due to its weight is decreased, and thus the display panel 10 is not easily damaged even when an external impact is applied thereto.

The first plate 40 may include a folding pattern 40P. A shape or length of the folding pattern 40P may change when the display apparatus 1 is folded. In an embodiment, for example, the folding pattern 40P may be an opening portion provided in the first plate 40. According to an alternative embodiment, the folding pattern 40P may have an uneven shape. According to another embodiment, the folding pattern 40P may include links rotatably connected to each other.

According to an embodiment, when the display apparatus 1 is folded, the folding pattern 40P may be folded based on the folding axis FAX. According to an embodiment, the folding pattern 40P may be symmetric based on the folding axis FAX. According to an embodiment, a region of the first plate 40 where the folding pattern 40P is not provided may have a flat top surface.

The first plate 40 may include at least one selected from metal, glass, and plastic. According to an embodiment, the first plate 40 may include polyurethane. According to an alternative embodiment, the first plate 40 may include carbon fiber reinforced plastic (CFRP). According to an embodiment, the folding pattern 40P may include a material which is the same as or different from a material of the first plate 40.

The second plate 60 may be arranged below the first plate 40. In an embodiment, the first plate 40 may be arranged between the support layer 30 and the second plate 60. The second plate 60 may externally transmit heat generated in the display apparatus 1. Also, the second plate 60 may protect the display apparatus 1 from an external impact. According to an embodiment, the second plate 60 may include a material having a high heat transfer rate. In an embodiment, for example, the second plate 60 may include metal or graphite. The second plate 60 may be relatively thin in an embodiment where the second plate 60 includes graphite compared to an embodiment where the second plate 60 includes metal. According to an embodiment, the second plate 60 may include a first second plate 60A and a second plate 60B spaced apart from each other based on the folding axis FAX.

Although not shown in FIG. 3, a digitizer (not shown) may be arranged between the first plate 40 and the second plate 60. The digitizer may include a body layer and/or a pattern layer. The digitizer may detect a signal input from an external electronic pen or the like through the pattern layer. In particular, the digitizer may detect intensity, direction, and the like of the signal input from the electronic pen or the like. In an embodiment, the digitizer may include a first digitizer and a second digitizer spaced apart from each other based on the folding axis FAX. Accordingly, damage to the digitizer when the display apparatus 1 is folded may be effectively prevented or substantially reduced.

The cushion layer 70 may be arranged below the second plate 60. The second plate 60 may be arranged between the first plate 40 and the cushion layer 70. The cushion layer 70 may prevent or reduce damage to the display apparatus 1 due to an external impact. According to an embodiment, the cushion layer 70 may include a first portion 70A and a second portion 70B spaced apart from each other based on the folding axis FAX. According to an embodiment, the cushion layer 70 may include a pressure sensitive adhesive. The cushion layer 70 will be described below in greater detail.

The waterproof layer 80 may be arranged outside the second plate 60 and cushion layer 70. The waterproof layer 80 blocks or absorbs moisture introduced from the outside of the display apparatus 1, thereby effectively preventing or substantially reducing damage to components of the display apparatus 1 due to moisture. According to an embodiment, the waterproof layer 80 may include a tape and/or sponge.

The adhesive layer AL may be arranged between two neighboring components of the display apparatus 1. The adhesive layer AL may adhere the first component and the second component to each other. According to an embodiment, the adhesive layer AL may be a pressure sensitive adhesive. According to an alternative embodiment, the adhesive layer AL may be an optically clear adhesive. The adhesive layer AL may include a first adhesive layer AL1, a second adhesive layer AL2, a third adhesive layer AL3, a fourth adhesive layer AL4, a fifth adhesive layer AL5, and a sixth adhesive layer AL6.

The first adhesive layer AL1 may be arranged between the first protective layer PB1 and the cover window 20. The first adhesive layer AL1 may adhere the first protective layer PB1 and the cover window 20 to each other. The second adhesive layer AL2 may be arranged between the first protective layer PB1 and the display panel 10. The second adhesive layer AL2 may adhere the first protective layer PB1 and the display panel 10 to each other. The third adhesive layer AL3 may be arranged between the display panel 10 and the second protective layer PB2. The third adhesive layer AL3 may adhere the display panel 10 and the second protective layer PB2 to each other. The fourth adhesive layer AL4 may be arranged between the second protective layer PB2 and the support layer 30. The fourth adhesive layer AL4 may adhere the second protective layer PB2 and the support layer 30 to each other. The fifth adhesive layer AL5 may be arranged between the support layer 30 and the first plate 40. The fifth adhesive layer AL5 may adhere the support layer 30 and the first plate 40 to each other. According to an embodiment, the fifth adhesive layer AL5 may not overlap the folding pattern 40P. The sixth adhesive layer AL6 may be arranged between the first plate 40 and the second plate 60. The sixth adhesive layer AL6 may adhere the first plate 40 and the second plate 60 to each other. According to an embodiment, the sixth adhesive layer AL6 may prevent or reduce impurities being introduced to the folding pattern 40P of the first plate 40.

In an embodiment, a through hole overlapping the component area CA may be defined in each of the fourth adhesive layer AL4, support layer 30, fifth adhesive layer AL5, first plate 40, sixth adhesive layer AL6, second plate 60, and cushion layer 70. In such an embodiment, acoustic transmittance and/or light transmittance reaching from the outside to the component COMP may be increased. According to an alternative embodiment, a through hole overlapping the component area CA may not be defined in at least one selected from the fourth adhesive layer AL4, support layer 30, fifth adhesive layer AL5, first plate 40, sixth adhesive layer AL6, second plate 60, and cushion layer 70. According to an embodiment, the second protective layer PB2 may be continuously arranged in the main area MA and component area CA. In such an embodiment, the second protective layer PB2 may protect the display panel 10. According to an alternative embodiment, a through hole overlapping the component area CA may be defined further in the second protective layer PB2.

The component COMP may be arranged between the housing HS and the display panel 10. According to an embodiment, the component COMP may be adhered to the housing HS. According to an alternative embodiment, the component COMP may be arranged in the accommodating space AS. The component COMP may include an electronic module. In an embodiment, for example, the electronic module may include a sensor receiving and using light, such as an infrared sensor, a camera capturing an image by receiving light, a sensor measuring a distance by outputting and detecting light or sound, or recognizing a fingerprint, a small lamp outputting light, and/or a speaker outputting sound. The electronic module using light may use light of various wavelength bands, such as visible light, infrared light, and/or ultraviolet light.

According to an embodiment, the component COMP may include a light-emitting module and a light-receiving module. The light-emitting module and the light-receiving module may have an integrated structure or physically separated structure, and a pair of the light-emitting module and the light-receiving module may form one component COMP.

Figure 4:
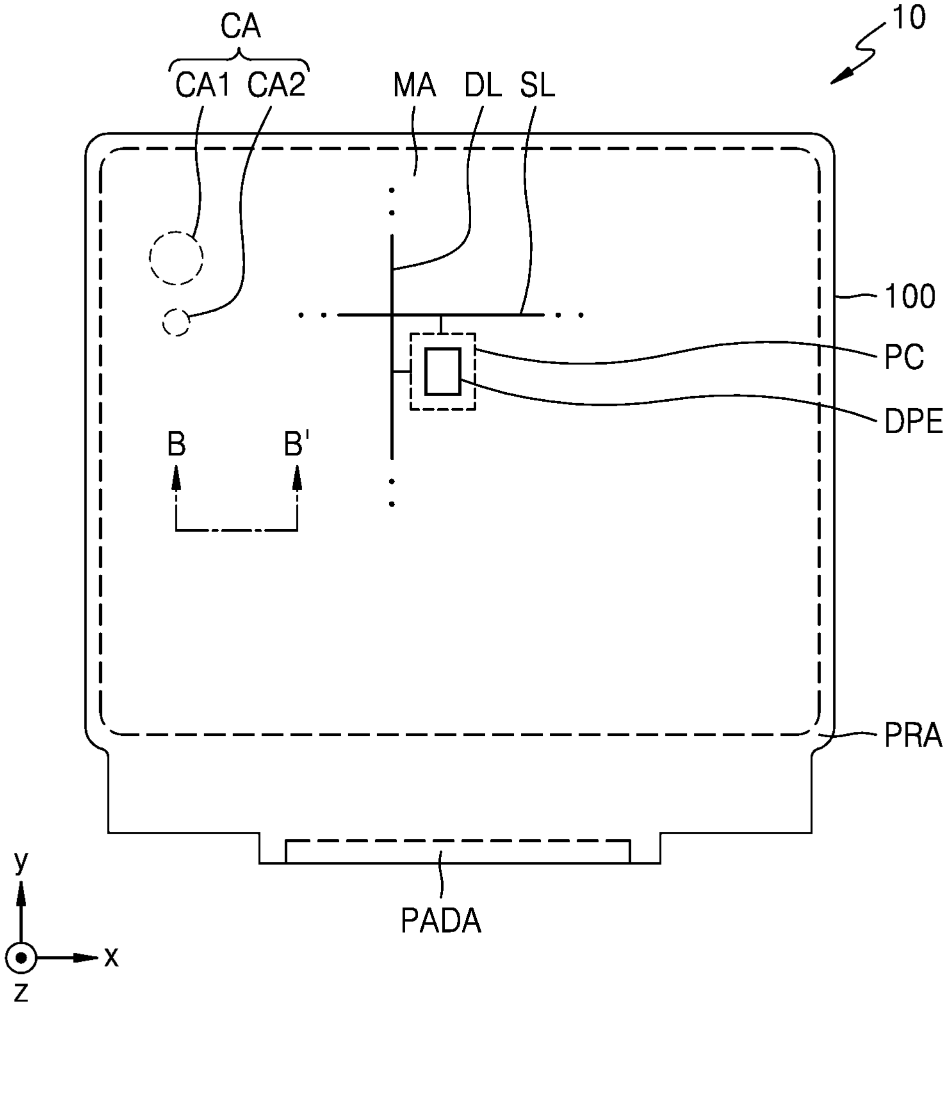
FIG. 4 is a plan view of a display panel included in a display apparatus, according to an embodiment.
Figure 5:
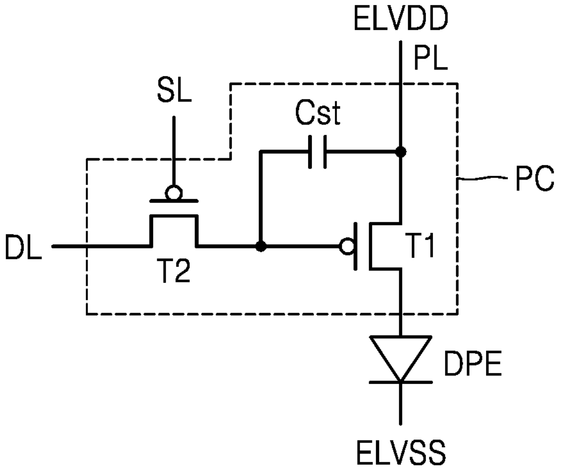
FIG. 5 is an equivalent circuit diagram of a pixel circuit of a display panel and a display element connected to the pixel circuit.

FIG. 4 is a plan view of the display panel 10 included in the display apparatus 1, according to an embodiment. FIG. 5 is an equivalent circuit diagram of a pixel circuit PC of the display panel 10 and a display element DPE connected to the pixel circuit PC.

Referring to FIGS. 4 and 5, an embodiment of the display panel 10 may include the main area MA, the component area CA, and a peripheral area PRA. The display panel 10 may include a substrate 100, the pixel circuit PC, a scan line SL, a data line DL, a driving voltage line PL, and the display element DPE. According to an embodiment, the main area MA, the component area CA, and the peripheral area PRA may be defined in the substrate 100. In such an embodiment, the substrate 100 may include the main area MA, the component area CA, and the peripheral area PRA. Hereinafter, embodiments in which the substrate 100 includes the main area MA, the component area CA, and the peripheral area PRA will be mainly described in detail.

The pixel circuit PC and the display element DPE may overlap at least one selected from the main area MA and the component area CA. The pixel circuit PC may include a driving thin-film transistor T1, a switching thin-film transistor T2, and a storage capacitor Cst. The display element DPE may be configured to emit red, green, or blue light, or may emit red, green, blue, or white light.

The switching thin-film transistor T2 is connected to the scan line SL and the data line DL, and may be configured to transmit, to the driving thin-film transistor T1, a data signal or data voltage input from the data line DL based on a scan signal or scan voltage input from the scan line SL.

The storage capacitor Cst is connected to the switching thin-film transistor T2 and the driving voltage line PL, and may be configured to store a voltage corresponding to a difference between a voltage received from the switching thin-film transistor T2 and a first power voltage ELVDD supplied to the driving voltage line PL.

The driving thin-film transistor T1 is connected to the driving voltage line PL and the storage capacitor Cst, and may be configured to control a driving current flowing through the display element DPE from the driving voltage line PL in response to a voltage value stored in the storage capacitor Cst. The display element DPE may be configured to emit light of a certain luminance corresponding to the driving current. An opposing electrode (for example, a cathode) of the display element DPE may be configured to receive a second power voltage ELVSS.

In an embodiment, as shown in FIG. 5, the pixel circuit PC includes two thin-film transistors and one storage capacitor, but not being limited thereto. Alternatively, the pixel circuit PC may include three or more thin-film transistors.

The component area CA may be at least partially surrounded by the main area MA. According to an embodiment, the component area CA may be entirely surrounded by the main area MA. The component area CA may include a pixel area where the display element DPE is arranged and a transmission area where the display element DPE is not arranged. Accordingly, light transmittance of the display panel 10 in the component area CA may be higher than light transmittance of the display panel 10 in the main area MA. According to an embodiment, the component area CA may include the first component area CA1 and the second component area CA2.

The peripheral area PRA may be located outside the main area MA. According to an embodiment, the peripheral area PRA may entirely surround the main area MA. A scan driver (not shown) configured to provide a scan signal to the pixel circuit PC, a data driver (not shown) configured to provide a data signal, and power supply wiring (not shown) configured to provide the first power voltage ELVDD and/or the second power voltage ELVSS may be arranged in the peripheral area PRA. The peripheral area PRA may include a pad area PADA. A pad (not shown) may be arranged in the pad area PADA and a display circuit board may be connected to the pad.

Figure 6:
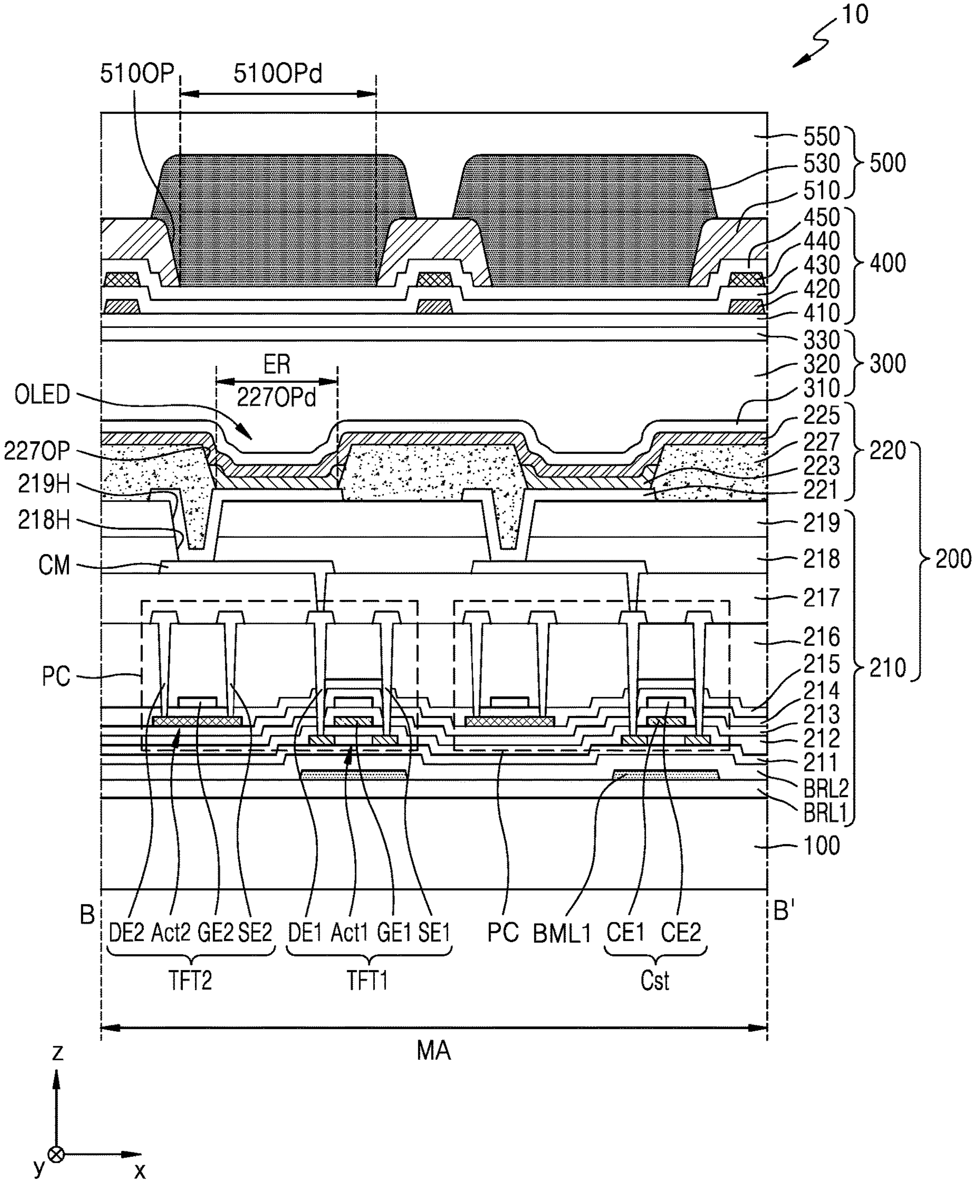
FIG. 6 is a cross-sectional view of the display panel of FIG. 4 taken along line B-B' of FIG. 4.

FIG. 6 is a cross-sectional view of the display panel 10 taken along line B-B' of FIG. 4. As shown in FIG. 6, an embodiment of the display panel 10 may include the substrate 100, a display layer 200, an encapsulation layer 300, a touch sensor layer 400, and an antireflection layer 500. The substrate 100 may include glass or a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. According to an embodiment, the substrate 100 may have a multilayer structure including a base layer including the polymer resin described above and a barrier layer (not shown). The substrate 100 including the polymer resin may be flexible, rollable, or bendable.

The display layer 200 may be disposed on the substrate 100. The display layer 200 may include a pixel circuit layer 210 and a display element layer 220. The pixel circuit layer 210 may include a first barrier layer BRL1, a first metal layer BML1, a second barrier layer BRL2, the pixel circuit PC, a connection electrode CM, and a plurality of insulating layers. The pixel circuit PC may include a first thin-film transistor TFT1, a second thin-film transistor TFT2, and the storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a first electrode CE1 and a second electrode CE2. The plurality of insulating layers may include a buffer layer 211, a first inorganic insulating layer 212, a gate insulating layer 213, an intermediate insulating layer 214, a second inorganic insulating layer 215, an interlayer insulating layer 216, a first organic insulating layer 217, a second organic insulating layer 218, and a third organic insulating layer 219.

The first barrier layer BRL1 may be disposed on the substrate 100. The first barrier layer BRL1 may include an inorganic material, such as silicon nitride ($SiN_x$), silicon oxynitride (SiON), and/or silicon oxide ($SiO_2$). According to some embodiments, the first barrier layer BRL1 may include amorphous silicon (a-Si). According to an embodiment, the first barrier layer BRL1 may be a single layer or multilayer including at least one selected from the above-described materials.

The first metal layer BML1 may be disposed on the first barrier layer BRL1. The first metal layer BML1 may overlap the first thin-film transistor TFT1. The first metal layer BML1 may operate as a lower protection metal layer that protects layers disposed thereabove. According to an embodiment, the first metal layer BML1 may not overlap the second thin-film transistor TFT2. According to some embodiments, a constant voltage or signal may be applied to the first metal layer BML1. The first metal layer BML1 may enable a charge to be easily supplied to a back channel portion of the pixel circuit PC. The first metal layer BML1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). According to an embodiment, the first metal layer BML1 may include doped a-Si. The first metal layer BML1 may be a single layer or multilayer including at least one selected from the above-described materials.

The second barrier layer BRL2 may be disposed on the first barrier layer BRL1. The second barrier layer BRL2 may include an inorganic material, such as $SiN_x$, SiON, and/or $SiO_2$. According to some embodiments, the second barrier layer BRL2 may include a-Si. According to an embodiment, the second barrier layer BRL2 may be a single layer or multilayer including at least one selected from the above-described materials.

The buffer layer 211 may be disposed on the second barrier layer BRL2. The buffer layer 211 may include an inorganic material, such as $SiN_x$, SiON, and/or $SiO_2$, and may be a single layer or multilayer including at least one selected from the above-described inorganic materials.

The first semiconductor layer Act1 may be disposed on the buffer layer 211. The first semiconductor layer Act1 may include a silicon semiconductor. According to an embodiment, the first semiconductor layer Act1 may include polysilicon. The first semiconductor layer Act1 may include a channel region, and drain region and a source region, which are arranged on opposing sides of the channel region, respectively. According to an alternative embodiment, the first semiconductor layer Act1 may include an organic semiconductor or an oxide semiconductor.

The first inorganic insulating layer 212 may be disposed on the first semiconductor layer Act1. The first inorganic insulating layer 212 may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), and/or zinc oxide (ZnO).

The first gate electrode GE1 may be disposed on the first inorganic insulating layer 212. The first gate electrode GE1 may overlap the first semiconductor layer Act1. The first gate electrode GE1 may include a low-resistance metal material. The first gate electrode GE1 may include a conductive material including Mo, Al, Cu, or Ti, and may be formed in or defined by a multilayer or single layer including at least one selected from the above-described conductive materials.

The gate insulating layer 213 may be disposed on the first gate electrode GE1. The gate insulating layer 213 may include an inorganic insulating material, such as $SiO_2$, $SiN_x$, SiON, $Al_2O_3$, $TiO_2$, $Ta_2O_5$, $HfO_2$, or ZnO.

The second electrode CE2 may be disposed on the gate insulating layer 213. According to an embodiment, the second electrode CE2 may overlap the first gate electrode GE1. The second electrode CE2 and the first gate electrode GE1 may collectively define the storage capacitor Cst along with a portion of the gate insulating layer 213 therebetween. In such an embodiment, the first gate electrode GE1 may operate as the first electrode CE1 of the storage capacitor Cst. As such, the storage capacitor Cst may overlap the first thin-film transistor TFT1. According to an alternative embodiment, the storage capacitor Cst may not overlap the first thin-film transistor TFT1. The second electrode CE2 may include Al, Pt, Pd, Ag, Mg, Au, Ni, Nd, Ir, Cr, Ca, Mo, Ti, W, and/or Cu, and may be a single layer or multilayer including at least one selected from the above-described materials.

The intermediate insulating layer 214 may be disposed on the second electrode CE2. The intermediate insulating layer 214 may include $SiO_2$, $SiN_x$, SiON, $Al_2O_3$, $TiO_2$, $Ta_2O_5$, $HfO_2$, or ZnO.

The second semiconductor layer Act2 may be disposed on the intermediate insulating layer 214. According to an embodiment, the second semiconductor layer Act2 may be disposed on the first inorganic insulating layer 212. The second semiconductor layer Act2 may include a channel region, and a source region and a drain region, which are arranged on opposing sides of the channel region, respectively. The second semiconductor layer Act2 may include an oxide semiconductor. In an embodiment, for example, the second semiconductor layer Act2 may include, as a Zn oxide-based material, a Zn oxide, an In—Zn oxide, or a Ga—In—Zn oxide. Alternatively, the second semiconductor layer Act2 may include an In—Ga—Zn—O (IGZO), In—Sn—Zn—O (ITZO), or In—Ga—Sn—Zn—O (IGTZO) semiconductor, where metal, such as In, Ga, or Sn is contained in ZnO.

The source region and drain region of the second semiconductor layer Act2 may be formed by conducting the oxide semiconductor by adjusting carrier concentration thereof. In an embodiment, for example, the source region and drain region of the second semiconductor layer Act2 may be formed by increasing the carrier concentration by performing a plasma process on the oxide semiconductor by using a hydrogen-based gas, a fluorine-based gas, or a combination thereof.

The Second inorganic insulating layer 215 may be disposed on the second semiconductor layer Act2. The second inorganic insulating layer 215 may include an inorganic insulating material, such as $SiO_2$, $SiN_x$, SiON, $Al_2O_3$, $TiO_2$, $Ta_2O_5$, $HfO_2$, and/or ZnO.

The second gate electrode GE2 may be disposed on the second inorganic insulating layer 215. The second gate electrode GE2 may overlap the second semiconductor layer Act2. The second gate electrode GE2 may overlap the channel region of the second semiconductor layer Act2. The second gate electrode GE2 may include Al, Pt, Pd, Ag, Mg, Au, Ni, Nd, Ir, Cr, Ca, Mo, Ti, W, and/or Cu, and may be a single layer or multilayer including at least one selected from the above-described materials.

The interlayer insulating layer 216 may be disposed on the second gate electrode GE2. The interlayer insulating layer 216 may include $SiO_2$, $SiN_x$, SiON, $Al_2O_3$, $TiO_2$, $Ta_2O_5$, $HfO_2$, or ZnO. The interlayer insulating layer 216 may be a single layer or multilayer including at least one selected from the inorganic insulating materials described above.

The first source electrode SE1 and the first drain electrode DE1 may be disposed on the interlayer insulating layer 216. The first source electrode SE1 and the first drain electrode DE1 may be connected to the first semiconductor layer Act1. According to an embodiment, the first source electrode SE1 and the first drain electrode DE1 may be connected to the first semiconductor layer Act1 through contact holes defined in (or formed through) the insulating layers. In an embodiment, for example, the first source electrode SE1 and first drain electrode DE1 may each be connected to the first semiconductor layer Act1 through a contact hole defined in the first inorganic insulating layer 212, a contact hole defined in the gate insulating layer 213, a contact hole of the intermediate insulating layer 214, a contact hole defined in the second inorganic insulating layer 215, and a contact hole defined in the interlayer insulating layer 216. The contact hole defined in first inorganic insulating layer 212, the contact hole defined in the gate insulating layer 213, the contact hole defined in the intermediate insulating layer 214, the contact hole defined in the second inorganic insulating layer 215, and the contact hole defined in the interlayer insulating layer 216 may overlap each other.

The second source electrode SE2 and the second drain electrode DE2 may be disposed on the interlayer insulating layer 216. The second source electrode SE2 and the second drain electrode DE2 may be connected to the second semiconductor layer Act2. The second source electrode SE2 and second drain electrode DE2 may each be connected to the second semiconductor layer Act2 through the contact hole defined in the second inorganic insulating layer 215 and the contact hole defined in the interlayer insulating layer 216.

The first source electrode SE1, the first drain electrode DE1, the second source electrode SE2, and the second drain electrode DE2 may each include a material having high conductivity. The first source electrode SE1, the first drain electrode DE1, the second source electrode SE2, and the second drain electrode DE2 may each include a conductive material including Mo, Al, Cu, or Ti, and each be a multilayer or single layer including at least one selected from the above-described conductive materials. According to an embodiment, the first source electrode SE1, the first drain electrode DE1, the second source electrode SE2, and the second drain electrode DE2 may have a multilayer structure of Ti/Al/Ti.

The first thin-film transistor TFT1 including the first semiconductor layer Act1 including a silicon semiconductor has high reliability, and thus may be employed as a driving thin-film transistor to realize the display panel 10 having high quality.

Because an oxide semiconductor has high carrier mobility and a low leakage current, a voltage drop may not be large even when a driving time is long. In other words, a color change of an image caused by the voltage drop is not large even during low-frequency driving, and thus the low-frequency driving is possible. As such, the oxide semiconductor has the low leakage current, and thus the leakage current may be prevented while reducing power consumption by employing the oxide semiconductor for at least one of thin-film transistors other than the driving thin-film transistor. In an embodiment, for example, the second thin-film transistor TFT2 may include the second semiconductor layer Act2 including an oxide semiconductor.

The first organic insulating layer 217 may cover the first source electrode SE1, the first drain electrode DE1, the second source electrode SE2, and the second drain electrode DE2. The first organic insulating layer 217 may include an organic material. In an embodiment, for example, the first organic insulating layer 217 may include an organic insulating material, such as a general-purpose polymer, for example, polymethylmethacrylate (PMMA) or polystyrene (PS), a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof.

The connection electrode CM may be disposed on the first organic insulating layer 217. The connection electrode CM may be connected to the first drain electrode DE1 or the first source electrode SE1 through the contact hole defined in the first organic insulating layer 217. The connection electrode CM may include a material having good conductivity. The connection electrode CM may include a conductive material including Mo, Al, Cu, or Ti, and may be formed in or defined by a multilayer or single layer including at least one selected from the above-described conductive materials. According to an embodiment, the connecting electrode CM may have a multilayer structure of Ti/Al/Ti.

The second organic insulating layer 218 and the third organic insulating layer 219 may be disposed on the first organic insulating layer 217 to cover the connection electrode CM. The second organic insulating layer 218 and the third organic insulating layer 219 may include an organic material. In an embodiment, for example, the second organic insulating layer 218 and the third organic insulating layer 219 may each include an organic insulating material, such as a general-purpose polymer, for example, PMMA or PS, a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof. The second organic insulating layer 218 and the third organic insulating layer 219 are sequentially stacked on the first organic insulating layer 217, and thus the display element layer 220 may be disposed on the pixel circuit layer 210 that is flat. According to an alternative embodiment, the third organic insulating layer 219 may be omitted.

The display element layer 220 may be disposed on the pixel circuit layer 210. The display element layer 220 may include a display element, for example, an organic light-emitting diode OLED. The organic light-emitting diodes OLED may be provided in plural and arranged in the main area MA. In other words, the plurality of organic light-emitting diodes OLED may be arranged in the main area MA. The organic light-emitting diode OLED may include a pixel electrode 221, an emission layer 223, an opposing electrode 225, and a pixel-defining layer 227.

The pixel electrode 221 may be disposed on the third organic insulating layer 219. The pixel electrode 221 may be connected to the connection electrode CM through a contact hole 218H defined in the second organic insulating layer 218 and a contact hole 219H of the third organic insulating layer 219. The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to an alternative embodiment, the pixel electrode 221 may include a reflective layer including Ag, Mg, Al, Pt, Pd, Au, Ni, Nd, Ir, Cr, or a compound thereof. According to another alternative embodiment, the pixel electrode 221 may further include a layer formed of ITO, IZO, ZnO, or $In_2O_3$, on/below the reflective layer.

An opening portion 227OP may be defined in the pixel-defining layer 227 to expose at least a part of the pixel electrode 221. The opening portion 227OP of the pixel-defining layer 227 may define an emission region ER of the organic light-emitting diode OLED. The emission region ER of the organic light-emitting diode OLED may correspond to a sub-pixel. According to an embodiment, the opening portions 227OP may be provided in plural in the pixel-defining layer 227. A plurality of opening portions 227OP may define a plurality of emission regions ER of the plurality of organic light-emitting diodes OLED.

The pixel-defining layer 227 may include an organic insulating material. According to an alternative embodiment, the pixel-defining layer 227 may include an inorganic insulating material, such as $SiN_x$, SiON, or $SiO_2$. According to another alternative embodiment, the pixel-defining layer 227 may include an organic insulating material and an inorganic insulating material. According to some embodiments, the pixel-defining layer 227 may include a light-blocking material and be provided in black. The light-blocking material may include a resin or paste including carbon black, carbon nanotubes, or black dyes, metal particles such as nickel, aluminum, molybdenum, and an alloy thereof, metal oxide particles (for example, chromium oxide), or metal nitride particles (for example, chromium nitride). In an embodiment where the pixel-defining layer 227 includes the light-blocking material, external light reflection caused by metal structures arranged at a lower portion of the pixel-defining layer 227 may be reduced.

The emission layer 223 may be arranged in the opening portion 227OP of the pixel-defining layer 227. The emission layer 223 may include a high-molecular weight organic material or low-molecular weight organic material, which emit light of a certain color. Although not illustrated, a first functional layer and a second functional layer may be disposed below and on the emission layer 223. The first functional layer may include, for example, a hole transport layer (HTL) or may include an HTL and a hole injection layer (HIL). The second functional layer is a component disposed on the emission layer 223 and may be optional. The second functional layer may include an electron transport layer (ETL) and/or an electron injection layer (EIL). Like the opposing electrode 225 described below, the first functional layer and/or the second functional layer may be a common layer formed to entirely cover the substrate 100.

The opposing electrode 225 may be disposed on the emission layer 223. The opposing electrode 225 may include a conductive material with a low work function. In an embodiment, for example, the opposing electrode 225 may include (semi-)transparent layer including Ag, Mg, Al, Pt, Pd, Au, Ni, Nd, Ir, Cr, Li, Ca, or an alloy thereof. Also, the opposing electrode 225 may further include a layer including ITO, IZO, ZnO, or $In_2O_3$, on the (semi-)transparent layer including such a material. According to some embodiments, a capping layer (not shown) may be further disposed on the opposing electrode 225. The capping layer may include lithium fluoride (LiF), an inorganic material, and/or an organic material.

The encapsulation layer 300 may be disposed on the display element layer 220. The encapsulation layer 300 may protect the display element layer 220. According to an embodiment, the encapsulation layer 300 may include at least one inorganic encapsulation layer and at least one organic encapsulation layer. The at least one inorganic encapsulation layer may include at least one inorganic material selected from $Al_2O_3$, $TiO_2$, $Ta_2O_5$, ZnO, $SiO_2$, SiNx, and SiON. The at least one organic encapsulation layer may include a polymer-based material. In such an embodiment, the polymer-based material may include an acrylic resin, an epoxy resin, polyimide, and polyethylene, for example. According to an embodiment, the at least one organic encapsulation layer may include acrylate. According to an embodiment, the encapsulation layer 300 may include a first inorganic encapsulation layer 310, an organic encapsulation layer 320, and a second inorganic encapsulation layer 330, which are sequentially stacked one on another in a stated order.

The touch sensor layer 400 may be disposed on the encapsulation layer 300. The touch sensor layer 400 may include a first touch insulating layer 410, a first touch conductive pattern 420, a second touch insulating layer 430, a second touch conductive pattern 440, and a third touch insulating layer 450.

The first touch insulating layer 410 may be disposed on the second inorganic encapsulation layer 330. According to an embodiment, the first touch insulating layer 410 may be a single layer or multilayer including an inorganic material, such as $SiN_x$, $SiO_2$, and/or SiON. According to some embodiments, the first touch insulating layer 410 may include an organic material. According to some embodiments, the first touch insulating layer 410 may be omitted.

The first touch conductive pattern 420 may be disposed on the first touch insulating layer 410 and/or the second inorganic encapsulation layer 330. According to an embodiment, the first touch conductive pattern 420 may overlap the pixel-defining layer 227. The first touch conductive pattern 420 may not overlap the opening portion 227OP of the pixel-defining layer 227. The first touch conductive pattern 420 may include a conductive material. In an embodiment, for example, the first touch conductive pattern 420 may include Mo, Al, Cu, or Ti, and may be formed in or defined by a multilayer or single layer including at least one selected from the above-described materials. According to an embodiment, the first touch conductive pattern 420 may have a stacked structure (Ti/Al/Ti) in which a Ti layer, an Al layer, and a Ti layer are sequentially stacked one on another in the stated order.

The second touch insulating layer 430 may cover the first touch conductive pattern 420. The second touch insulating layer 430 may be a single layer or multilayer including an inorganic material, such as $SiN_x$, $SiO_2$, and/or SiON. According to some embodiments, the second touch insulating layer 430 may include an organic material.

The second touch conductive pattern 440 may be disposed on the second touch insulating layer 430. According to an embodiment, the second touch conductive pattern 440 may overlap the pixel-defining layer 227. The second touch conductive pattern 440 may not overlap the opening portion 227OP of the pixel-defining layer 227. According to an embodiment, the second touch conductive pattern 440 may be connected to the first touch conductive pattern 420 through a contact hole provided in the second touch insulating layer 430. The second touch conductive pattern 440 may include a conductive material. In an embodiment, for example, the second touch conductive pattern 440 may include Mo, Al, Cu, or Ti, and may be formed in or defined by a multilayer or single layer including at least one selected from the above-described materials. According to an embodiment, the second touch conductive pattern 440 may have a stacked structure (Ti/Al/Ti) in which a Ti layer, an Al layer, and a Ti layer are sequentially stacked one on another in the stated order.

The first touch conductive pattern 420 and second touch conductive pattern 440 may include a plurality of sensing electrodes (not shown) for sensing a touch input. According to an embodiment, the plurality of sensing electrodes may sense an input by using a mutual capacitance method. According to an alternative embodiment, the plurality of sensing electrodes may sense an input by using a self-capacitance method.

The third touch insulating layer 450 may cover the second touch conductive pattern 440. According to an embodiment, the third touch insulating layer 450 may be a single layer or multilayer including an inorganic material, such as $SiN_x$, $SiO_2$, and/or SiON. According to some embodiments, the third touch insulating layer 450 may include an organic material.

The antireflection layer 500 may be disposed on the touch sensor layer 400. The antireflection layer 500 may include a black matrix 510, a color filter 530, and a planarization layer 550.

The black matrix 510 may be disposed on the third touch insulating layer 450. The black matrix 510 may at least partially absorb external light or internal reflection light. The black matrix 510 may include a black pigment. The black matrix 510 may overlap the first touch conductive pattern 420 and/or the second touch conductive pattern 440. Accordingly, reflection of light by the first touch conductive pattern 420 and/or the second touch conductive pattern 440 may be effectively prevented or substantially reduced.

An upper opening portion 510OP may be defined in the black matrix 510 to overlap the opening portion 227OP of the pixel-defining layer 227. The upper opening portion 510OP may be provided in plural in the main area MA. In the main area MA, a plurality of upper opening portions 510OP may overlap the plurality of opening portions 227OP, respectively.

The size of the upper opening portion 510OP may be greater than the size of the opening portion 227OP. The size of the upper opening portion 510OP may be the area of the upper opening portion 510OP on a plane. The size of the opening portion 227OP of the pixel-defining layer 227 may be the area of the opening portion 227OP of the pixel-defining layer 227 on a plane. According to an embodiment, the width 510OPd of the upper opening portion 510OP may be greater than the width 227OPd of the opening portion 227OP of the pixel-defining layer 227. The width 510OPd of the upper opening portion 510OP may be a shortest distance between a part of the black matrix 510 defining the upper opening portion 510OP and another part of the black matrix 510, which face each other. The width 227OPd of the opening portion 227OP of the pixel-defining layer 227 may be a shortest distance between a part of the pixel-defining layer 227 defining the opening portion 227OP and another part of the pixel-defining layer 227, which face each other. Accordingly, light emitted from the organic light-emitting diode OLED may proceed at a wide angle.

The color filter 530 may effectively prevent or substantially reduce reflection of light at the display panel 10. The color filter 530 may overlap the organic light-emitting diode OLED. According to an embodiment, the color filter 530 may overlap the upper opening portion 510OP. According to an embodiment, the color filters 530 may be provided in plural. A plurality of color filters 530 may overlap the main area MA. In the main area MA, the plurality of color filters 530 may overlap the plurality of upper opening portions 510OP, respectively. According to an embodiment, the adjacent color filters 530 may overlap each other. According to an alternative embodiment, the adjacent color filters 530 may not overlap each other.

The color filter 530 may be arranged based on a color of light emitted from the organic light-emitting diode OLED. The color filter 530 may include a red, green, or blue pigment or dye. Also, the color filter 530 may further include a quantum dot in addition to the above pigment or dye. Alternatively, the color filter 530 may not include the pigment or dye, and may include scattered particles, such as titanium oxide.

The planarization layer 550 may be disposed on the black matrix 510 and color filter 530. A top surface of the planarization layer 550 may be flat. According to an embodiment, the planarization layer 550 may include an organic material. In an embodiment, for example, the planarization layer 550 may include a polymer-based material. The polymer-based material may be transparent. In an embodiment, for example, the planarization layer 550 may include silicon-based resin, acryl-based resin, epoxy-based resin, polyimide, or polyethylene.

As described above, in an embodiment of the display apparatus 1 which is foldable based on the folding axis FAX, the thicknesses of components (in a z-axis direction) included in the display apparatus 1 is desired to be small. In such an embodiment, the thickness of the display panel 10 (in the z-axis direction) is desired to be small. However, when the thickness of the display panel 10 (in the z-axis direction) is too small, the display panel 10 may be easily damaged by an external impact. In such an embodiment, the cushion layer 70 may absorb the external impact applied to the display panel 10, thereby effectively preventing or substantially reducing damage to the display panel 10 due to the external impact.

According to an embodiment, the cushion layer 70 may include a material having viscoelasticity. In such an embodiment, the cushion layer 70 may include at least one of polyurethane, polyacrylate, and polyethylene. In an embodiment, for example, the cushion layer 70 may include at least one selected from urethane-based resin, acrylate-based resin, and ethylene-based resin. The cushion layer 70 may have a single layer or multilayer structure, and include a foam material similar to a sponge.

In an embodiment, the cushion layer 70 may have a low storage modulus and a high tangent delta. A degree to which the cushion layer 70 absorbs an external impact may vary according to the storage modulus and tangent delta of the cushion layer 70. When the storage modulus of cushion layer 70 is low, the cushion layer 70 may absorb more external impact, and when the tangent delta of cushion layer 70 is high, the cushion layer 70 may absorb more external impact. In other words, when the storage modulus of cushion layer 70 is low or when the tangent delta thereof is high, energy applied during an impact dissipates well, and even when same energy is transmitted, an impact transmission time is increased and maximum impact energy is reduced, and thus the impact may have a low effect. The storage modulus may denote energy stored without a loss by elasticity of a material, and the loss modulus may denote energy lost due to viscosity of a material.

The cushion layer 70 is soft when the storage modulus is low, and thus the cushion layer 70 may absorb more external impact. On the other hand, the cushion layer 70 is rigid when the storage modulus is high, and thus the cushion layer 70 may absorb less external impact. The tangent delta may be defined by a value obtained by dividing the loss modulus by the storage modulus (i.e., tangent delta=loss modulus/storage modulus). The cushion layer 70 is soft when the tangent delta is high, and thus the cushion layer 70 may absorb more external impact. On the other hand, the cushion layer 70 is rigid when the tangent delta is low, and thus the cushion layer 70 may absorb less external impact. In other words, when the storage modulus is high or tangent delta is low, energy applied during an impact dissipates badly, and thus even when same energy is transmitted, an impact transmission time is decreased and maximum impact energy may be increased. Accordingly, the cushion layer 70 may have the low storage modulus and the high tangent delta to absorb more external impact.

Hereinafter, results of testing storage moduli, loss moduli, and tangent deltas of a first cushion layer C1, a second cushion layer C2, and a third cushion layer C3 respectively included in display apparatuses according to embodiments will be described with reference to graphs and tables according to various temperatures and various frequencies. Also, for convenience of descriptions, results of testing storage moduli, loss moduli, and tangent deltas of a fourth cushion layer C4 and a fifth cushion layer C5 respectively included in display apparatuses according to comparative examples will be described with reference to the graphs and tables together with the results of the first cushion layer C1, second cushion layer C2, and third cushion layer C3.

In the specification, the storage moduli and the loss moduli of the first cushion layer C1 through the fifth cushion layer C5 are measured by a dynamic mechanical analysis (TA Instruments).

As test samples for measuring storage moduli and loss moduli, the first cushion layer C1 through the fifth cushion layer C5 were each processed in the size of 6 mm×50 mm in width and length. The thickness of each of the test samples of the first cushion layer C1 through the fifth cushion layer C5 was in a range of about 100 μm to about 150 μm.

Both ends of the test sample in a length direction were fixed by jigs, and a preload force was set to 0.05 N to evenly spread the test sample in the dynamic mechanical analysis. The preload force may be defined as force pre-applied to the test sample in the length direction by the jigs to evenly spread the test sample. The preload force is general content in the use of dynamic mechanical analysis, and thus detailed descriptions thereof are omitted.

Figure 7:
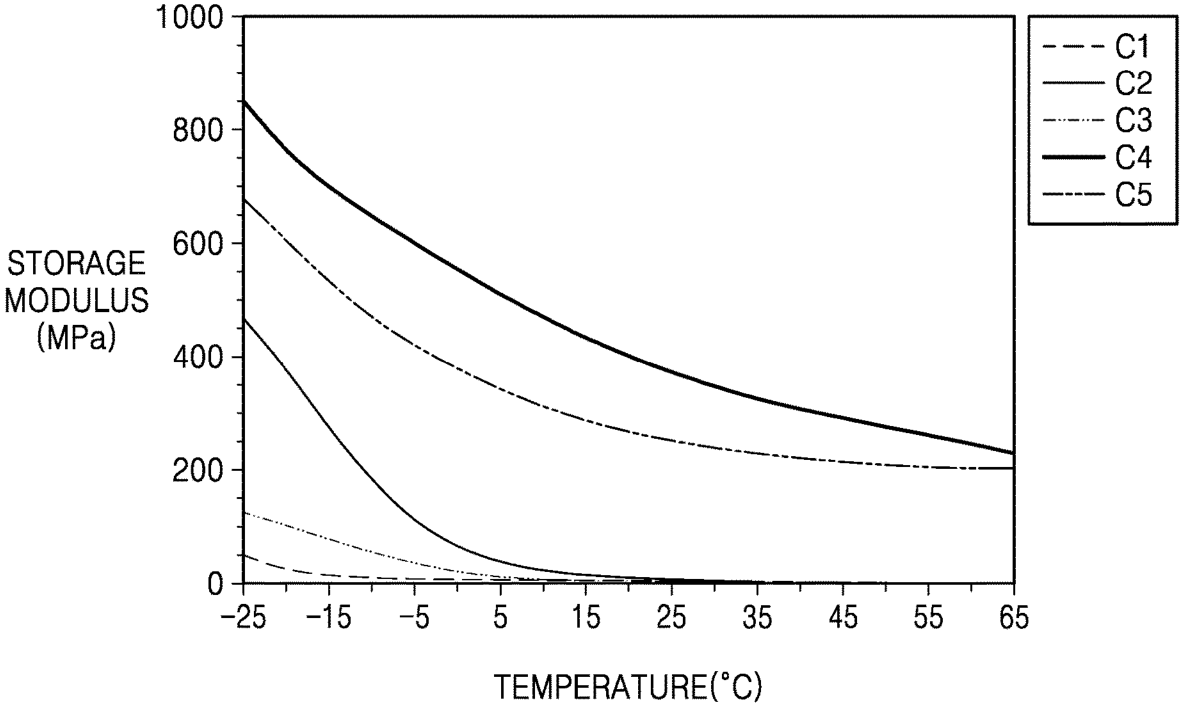
FIG. 7 is a graph of storage modulus according to temperature of cushion layers included in display apparatuses, according to embodiments.
Figure 8:
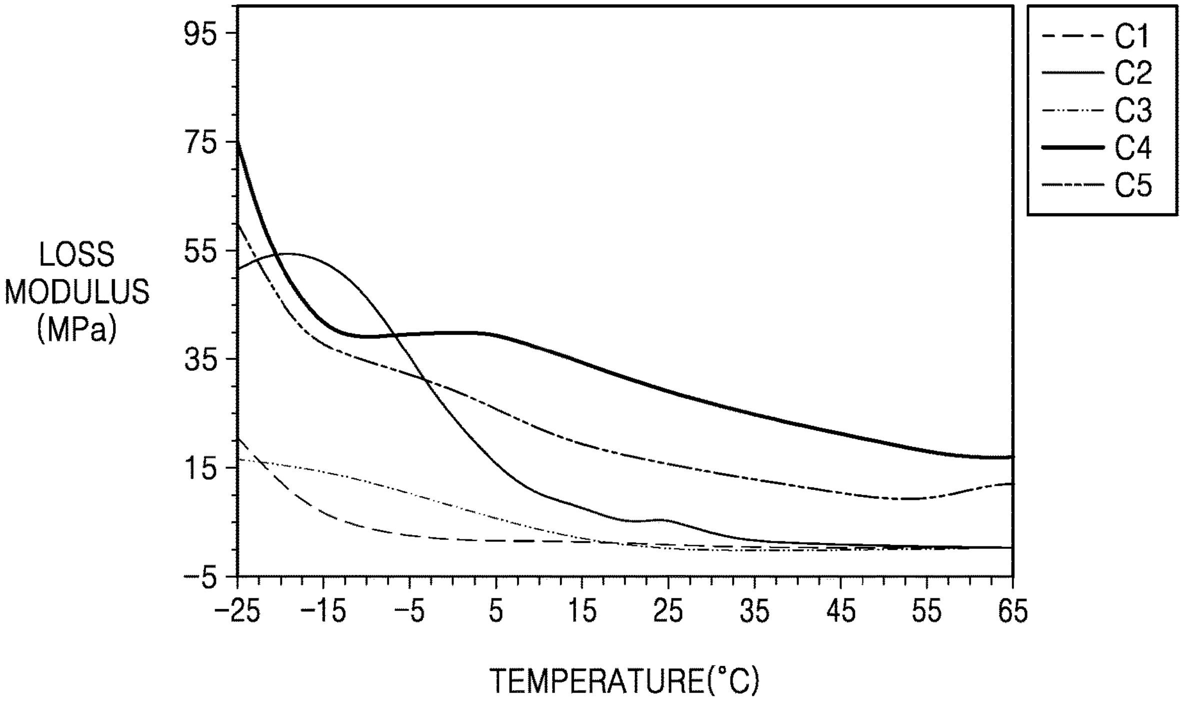
FIG. 8 is a graph of loss modulus according to temperature of cushion layers included in display apparatuses, according to embodiments.
Figure 9:
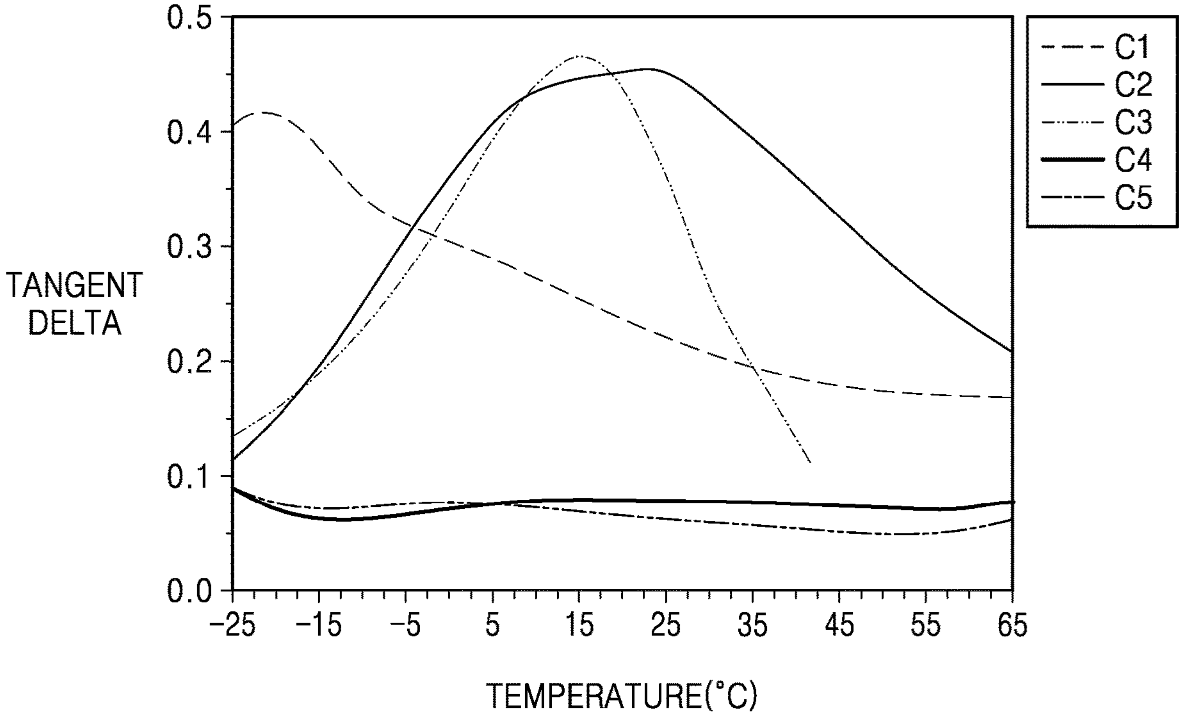
FIG. 9 is a graph of tangent delta according to temperature of cushion layers included in display apparatuses, according to embodiments.

FIG. 7 is a graph of storage modulus according to temperature of cushion layers included in display apparatuses, according to embodiments, FIG. 8 is a graph of loss modulus according to temperature of cushion layers included in display apparatuses, according to embodiments, and FIG. 9 is a graph of tangent delta according to temperature of cushion layers included in display apparatuses, according to embodiments. Table 1 shows storage moduli, loss moduli, and tangent deltas of the first cushion layer C1 through the fifth cushion layer C5, in conditions of 25° C., −20° C., and 60° C. 25° C. may be defined as a room temperature, −20° C. may be defined as a low temperature, and 60° C. may be defined as a high temperature.

The storage modulus and loss modulus were measured by the dynamic mechanical analysis, by applying vibration at a frequency of 1 Hz having amplitude of 10 μm to the test sample in a length direction, setting a force track to 125%, and setting a heating rate to 3° C./min.

TABLE 1

| | −20° C. | | | 25° C. | | | 60° C. | | |
|---|---|---|---|---|---|---|---|---|---|
| | Storage Modulus (MPa) | Loss Modulus (MPa) | Tangent Delta | Storage Modulus (MPa) | Loss Modulus (MPa) | Tangent Delta | Storage Modulus (MPa) | Loss Modulus (MPa) | Tangent Delta |
| C1 | 29.62 | 12.42 | 0.413 | 4.46 | 1.00 | 0.221 | 1.93 | 0.33 | 0.171 |
| C2 | 372.10 | 56.60 | 0.15 | 5.73 | 2.21 | 0.39 | 1.32 | 0.17 | 0.13 |
| C3 | 102.80 | 15.72 | 0.15 | 0.30 | 0.10 | 0.27 | | | |
| C4 | 766.10 | 53.09 | 0.069 | 377.60 | 29.60 | 0.078 | 243.30 | 17.41 | 0.072 |
| C5 | 607.70 | 46.01 | 0.077 | 251.60 | 15.78 | 0.062 | 204.60 | 10.74 | 0.054 |

Referring to FIGS. 7 through 9 and Table 1, the cushion layer 70 may have a storage modulus in a range of about 0.1 MPa to about 10.0 MPa at a temperature of 25° C. and a frequency of 1 Hz. In detail, the cushion layer 70 may have a storage modulus in a range of about 0.2 MPa to about 7.0 MPa at a temperature of 25° C. and a frequency of 1 Hz. In more detail, the cushion layer 70 may have a storage modulus in a range of about 0.3 MPa to about 5.8 MPa at a temperature of 25° C. and a frequency of 1 Hz. In more detail, the cushion layer 70 may have a storage modulus in a range of about 0.3 MPa to about 5.73 MPa, in a range of about 0.3 MPa to about 4.5 MPa, in a range of about 4.4 MPa to about 5.8 MPa, in a range of about 0.2 MPa to about 0.4 MPa, in a range of about 4.0 MPa to about 5.0 MPa, or in a range of about 5.2 MPa to about 6.2 MPa at a temperature of 25° C. and a frequency of 1 Hz.

Also, the cushion layer 70 may have a tangent delta in a range of about 0.1 to about 0.5 at a temperature of 25° C. and a frequency of 1 Hz. In detail, the cushion layer 70 may have a tangent delta in a range of about 0.15 to about 0.4 at a temperature of 25° C. and a frequency of 1 Hz. In more detail, the cushion layer 70 may have a tangent delta in a range of about 0.22 to about 0.39 at a temperature of 25° C. and a frequency of 1 Hz. In more detail, the cushion layer 70 may have a tangent delta in a range of about 0.221 to about 0.39, in a range of about 0.2 to about 0.3, in a range of about 0.24 to about 0.42, in a range of about 0.19 to about 0.25, in a range of about 0.24 to about 0.3, or in a range of about 0.36 to about 0.42 at a temperature of 25° C. and a frequency of 1 Hz.

In this case, the cushion layer 70 may have a loss modulus in a range of about 0.1 MPa to about 5.0 MPa. In detail, the cushion layer 70 may have a loss modulus in a range of about 0.1 MPa to about 3.0 MPa. In more detail, the cushion layer 70 may have a loss modulus in a range of about 0.1 MPa to about 2.3 MPa. In more detail, the cushion layer 70 may have a loss modulus in a range of about 0.1 MPa to about 2.21 MPa, in a range of about 0.05 MPa to about 1.05 MPa, in a range of about 0.95 MPa to about 2.25 MPa, in a range of about 0.05 MPa to about 0.15 MPa, in a range of about 0.95 MPa to about 1.05 MPa, or in a range of about 2.1 MPa to about 2.3 MPa at a temperature of 25° C. and a frequency of 1 Hz.

The storage modulus of cushion layer 70 having a viscoelastic material may decrease when a temperature increases, and may increase when a temperature decreases. The cushion layer 70 may have a storage modulus in a range of about 10.0 MPa to about 400.0 MPa at a temperature of −20° C. and a frequency of 1 Hz. In detail, the cushion layer 70 may have a storage modulus in a range of about 20.0 MPa to about 380.0 MPa at a temperature of −20° C. and a frequency of 1 Hz. In more detail, the cushion layer 70 may have a storage modulus in a range of about 29.6 MPa to about 372.1 MPa at a temperature of −20° C. and a frequency of 1 Hz. In more detail, the cushion layer 70 may have a storage modulus in a range of about 29.62 MPa to about 372.10 MPa, in a range of about 25.0 MPa to about 105.0 MPa, in a range of about 100.0 MPa to about 375.0 MPa, in a range of about 29.0 MPa to about 30.0 MPa, in a range of about 98.0 MPa to about 108.0 MPa, or in a range of about 367.0 MPa to about 377.0 MPa at a temperature of −20° C. and a frequency of 1 Hz.

The cushion layer 70 may have a tangent delta in a range of about 0.1 to about 0.5 at a temperature of −20° C. and a frequency of 1 Hz. In detail, the cushion layer 70 may have a tangent delta in a range of about 0.13 to about 0.45 at a temperature of −20° C. and a frequency of 1 Hz. In more detail, the cushion layer 70 may have a tangent delta of in a range of about 0.15 to about 0.42 at a temperature of −20° C. and a frequency of 1 Hz. In more detail, the cushion layer 70 may have a tangent delta in a range of about 0.15 to about 0.413, in a range of about 0.13 to about 0.17, in a range of about 0.17 to about 0.42, or in a range of about 0.40 to about 0.45 at a temperature of −20° C. and a frequency of 1 Hz.

In this case, the cushion layer 70 may have a loss modulus in a range of about 5.0 MPa to about 80.0 MPa. In detail, the cushion layer 70 may have a loss modulus in a range of about 10.0 MPa to about 60.0 MPa. In more detail, the cushion layer 70 may have a loss modulus in a range of about 12.0 MPa to about 57.0 MPa. In more detail, the cushion layer 70 may have a loss modulus in a range of about 12.42 MPa to about 56.60 MPa, in a range of about 12.0 MPa to about 16.0 MPa, in a range of about 15.0 MPa to about 57.0 MPa, in a range of about 12.0 MPa to about 13.0 MPa, in a range of about 15.0 MPa to about 16.0 MPa, or in a range of about 56.0 MPa to about 57.0 MPa.

As described above, the storage modulus of cushion layer 70 having a viscoelastic material may decrease when a temperature increases. The cushion layer 70 may have a storage modulus in a range of about 0.5 MPa to about 5.0 MPa at a temperature of 60° C. and a frequency of 1 Hz. In detail, the cushion layer 70 may have a storage modulus in a range of about 1.0 MPa to about 2.0 MPa at a temperature of 60° C. and a frequency of 1 Hz. In more detail, the cushion layer 70 may have a storage modulus in a range of about 1.3 MPa to about 2.0 MPa at a temperature of 60° C. and a frequency of 1 Hz. In more detail, the cushion layer 70 may have a storage modulus in a range of about 1.32 MPa to about 1.93 MPa, in a range of about 1.3 MPa to about 1.4 MPa, or in a range of about 1.9 MPa to about 2.0 MPa at a temperature of 60° C. and a frequency of 1 Hz.

Also, the cushion layer 70 may have a tangent delta in a range of about 0.1 to about 0.4 at a temperature of 60° C. and a frequency of 1 Hz. In detail, the cushion layer 70 may have a tangent delta in a range of about 0.12 to about 0.2 at a temperature of 60° C. and a frequency of 1 Hz. In more detail, the cushion layer 70 may have a tangent delta in a range of about 0.13 to about 0.18 at a temperature of 60° C. and a frequency of 1 Hz. In more detail, the cushion layer 70 may have a tangent delta in a range of about 0.13 to about 0.171, in a range of about 0.12 to about 0.15, or in a range of about 0.17 to about 0.18 at a temperature of 60° C. and a frequency of 1 Hz.

In this case, the cushion layer 70 may have a loss modulus in a range of about 0.1 MPa to about 0.5 MPa. In detail, the cushion layer 70 may have a loss modulus in a range of about 0.15 MPa to about 0.4 MPa. In more detail, the cushion layer 70 may have a loss modulus in a range of about 0.15 MPa to about 0.35 MPa. In more detail, the cushion layer 70 may have a loss modulus in a range of about 0.17 MPa to about 0.33 MPa, in a range of about 0.15 MPa to about 0.19 MPa, or in a range of about 0.31 MPa to about 0.35 MPa.

When the cushion layer 70 has such ranges of storage modulus, loss modulus, and tangent delta, the cushion layer 70 may be sufficiently soft to absorb an external impact. Such an effect may occur identically not only at a room temperature (for example, 25° C.), but also at a low temperature (for example, −20° C.) and a high temperature (for example, 60° C.). Accordingly, the cushion layer 70 absorbs more external impact applied to the display apparatus 1 and only a part of the external impact may be transmitted to the display panel 10. Accordingly, the display panel 10 may not be damaged by an external impact. At least one selected from the first cushion layer C1, the second cushion layer C2, and the third cushion layer C3 may have such ranges of storage modulus, loss modulus, and tangent delta.

In a case where the storage modulus of cushion layer 70 exceeds the above range or the tangent delta of the cushion layer 70 is less than the above range, the cushion layer 70 may be rigid. Accordingly, the cushion layer 70 may absorb less external impact applied to the display apparatus 1 and most external impact may be transmitted to the display panel 10. Accordingly, the display panel 10 may be easily damaged by an external impact. In a case where the storage modulus of cushion layer 70 is less than the above range or the tangent delta of cushion layer 70 exceeds the above range, the cushion layer 70 may be too soft and unable to maintain a certain shape. Accordingly, the cushion layer 70 may be flabby and difficult to be handled. The fourth cushion layer C4 and fifth cushion layer C5 are unable to have such ranges of storage modulus, loss modulus, and tangent delta.

When an external impact is applied to the display apparatus 1, vibration having a frequency of hundreds of Hz to thousands of Hz may be applied to the display apparatus 1 due to the external impact. Such vibration may also be applied to the cushion layer 70 included in the display apparatus 1. When vibration having a frequency of hundreds of Hz to thousands of Hz is applied to the cushion layer 70, a degree to which the cushion layer 70 absorbs or alleviates an external impact may vary according to the storage modulus, loss modulus, and tangent delta of the cushion layer 70.

Figure 10:
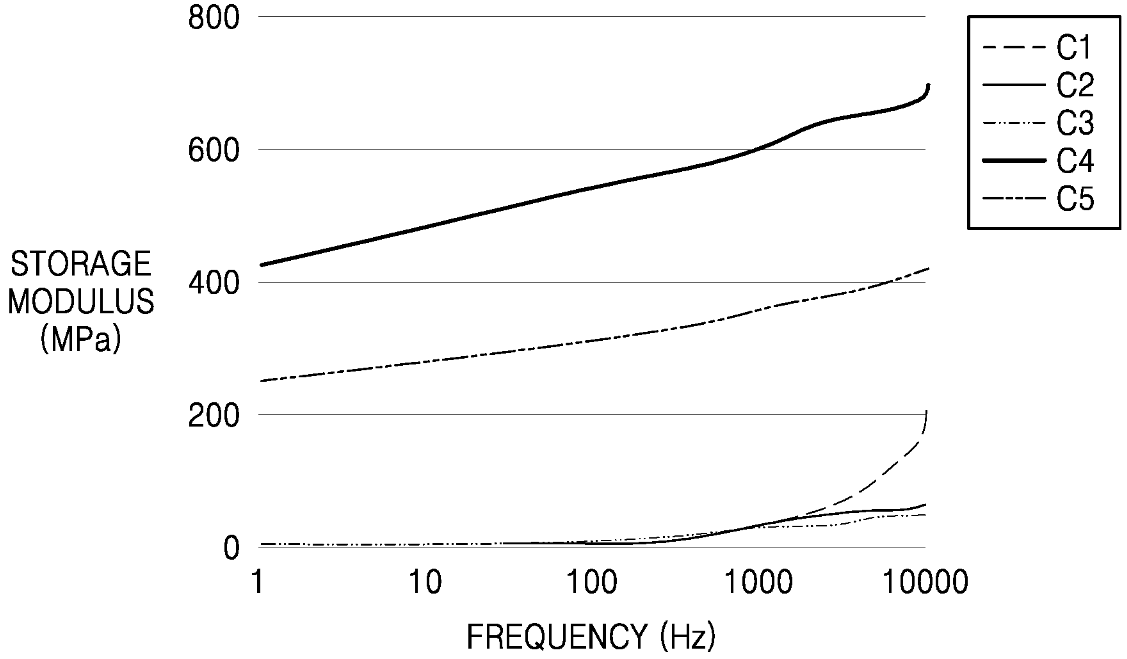
FIG. 10 is a graph of storage modulus according to frequency of cushion layers included in display apparatuses, according to embodiments.
Figure 11:
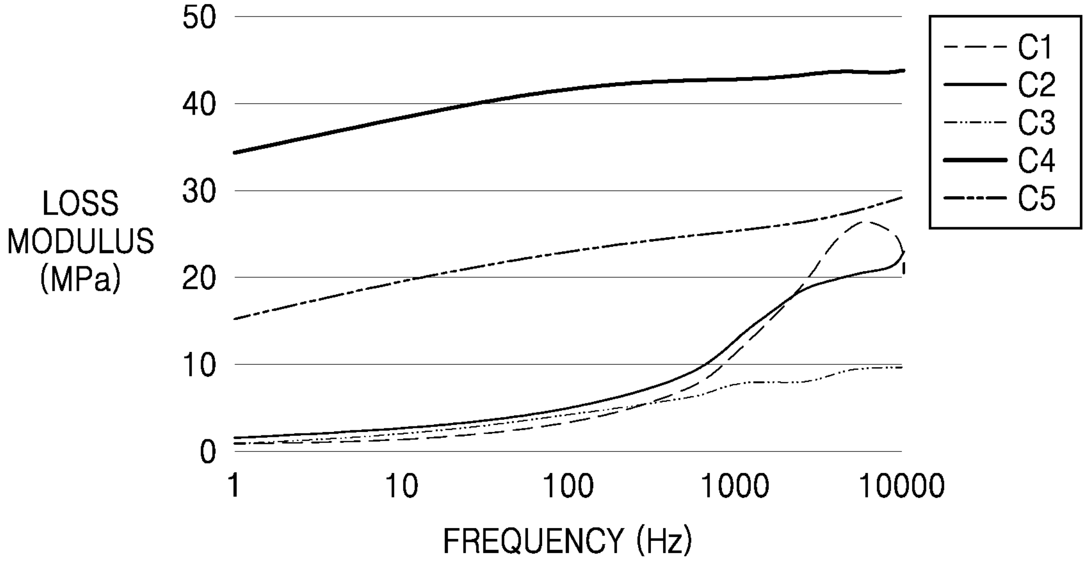
FIG. 11 is a graph of loss modulus according to frequency of cushion layers included in display apparatuses, according to embodiments.
Figure 12:
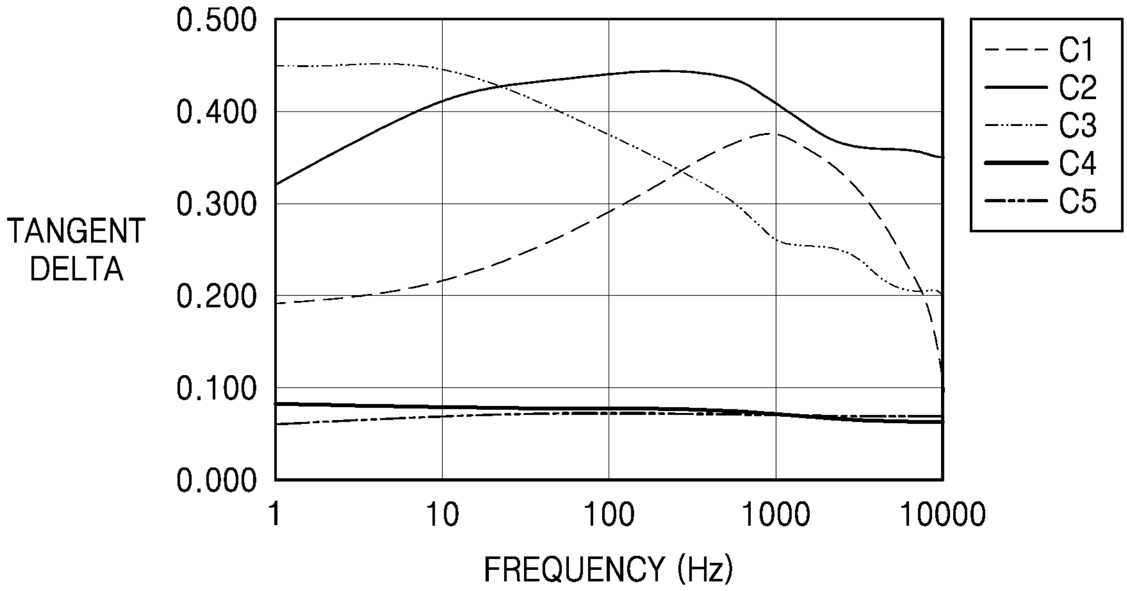
FIG. 12 is a graph of tangent delta according to frequency of cushion layers included in display apparatuses, according to embodiments.

FIG. 10 is a graph of storage modulus according to frequency of cushion layers included in display apparatuses, according to embodiments, FIG. 11 is a graph of loss modulus according to frequency of cushion layers included in display apparatuses, according to embodiments, and FIG. 12 is a graph of tangent delta according to frequency of cushion layers included in display apparatuses, according to embodiments. Table 2 shows storage moduli of the first cushion layer C1 through the fifth cushion layer C5 according to frequencies, and Table 3 shows loss moduli of the first cushion layer C1 through the fifth cushion layer C5 according to frequencies. Table 4 shows tangent deltas of the first cushion layer C1 through the fifth cushion layer C5 according to frequencies. Numerical values shown in FIGS. 10 through 12 and Tables 2 through 4 are measured at a temperature of 25° C., and a unit of storage moduli of Table 2 and a unit of loss moduli of Table 3 are MPa.

It is not easily to actually apply vibration having a frequency of thousands of Hz to the first cushion layer C1 through fifth cushion layer C5, and thus storage moduli, loss moduli, and tangent deltas of the first cushion layer C1 through fifth cushion layer C5 are measured by using the principle of time-temperature superposition (TTS). The principle of TTS is well known in the art in measurement of storage modulus or the like, and thus detailed descriptions thereof are omitted.

TABLE 2

| | 10 Hz | 100 Hz | 500 Hz | 1000 Hz | 2500 Hz | 5000 Hz | 9000 Hz | 10000 Hz |
|---|---|---|---|---|---|---|---|---|
| C1 | 5.66 | 10.20 | 19.25 | 29.76 | 57.63 | 101.00 | 161.30 | 200.80 |
| C2 | 5.834 | 10.2 | 19.61 | 30.93 | 50.17 | 55.74 | 60.97 | 64.66 |
| C3 | 3.791 | 10.38 | 19.16 | 27.95 | 31.5 | 42.54 | 45.16 | 46.13 |
| C4 | 482.10 | 541.30 | 577.40 | 603.60 | 642.00 | 655.00 | 673.90 | 694.30 |
| C5 | 275.30 | 313.00 | 338.40 | 358.90 | 379.30 | 393.40 | 414.30 | 419.10 |

TABLE 3

| | 10 Hz | 100 Hz | 500 Hz | 1000 Hz | 2500 Hz | 5000 Hz | 9000 Hz | 10000 Hz |
|---|---|---|---|---|---|---|---|---|
| C1 | 1.22 | 3.00 | 7.02 | 11.17 | 19.18 | 25.08 | 24.69 | 20.60 |
| C2 | 2.403 | 4.516 | 8.596 | 12.62 | 18.41 | 20.07 | 21.57 | 22.76 |
| C3 | 1.701 | 3.902 | 5.864 | 7.295 | 7.81 | 8.953 | 9.24 | 9.232 |
| C4 | 38.27 | 41.72 | 42.75 | 43.04 | 43.48 | 43.89 | 43.77 | 44.07 |
| C5 | 19.31 | 22.74 | 24.39 | 25.22 | 26.39 | 27.44 | 28.74 | 28.88 |

TABLE 4

| | 10 Hz | 100 Hz | 500 Hz | 1000 Hz | 2500 Hz | 5000 Hz | 9000 Hz | 10000 Hz |
|---|---|---|---|---|---|---|---|---|
| C1 | 0.2157 | 0.2944 | 0.3647 | 0.3753 | 0.3328 | 0.2571 | 0.1531 | 0.1026 |
| C2 | 0.4118 | 0.4427 | 0.4385 | 0.408 | 0.3669 | 0.3601 | 0.3538 | 0.352 |
| C3 | 0.4486 | 0.3761 | 0.306 | 0.261 | 0.2479 | 0.2105 | 0.2046 | 0.2001 |
| C4 | 0.07938 | 0.07707 | 0.07403 | 0.07131 | 0.06773 | 0.067 | 0.06495 | 0.06348 |
| C5 | 0.0701 | 0.07266 | 0.07207 | 0.07026 | 0.06957 | 0.06975 | 0.06938 | 0.06892 |

The storage modulus of cushion layer 70 may increase when vibration having a higher frequency is applied to the cushion layer 70. Referring to FIGS. 10 through 12 and Tables 2 through 4, the cushion layer 70 may have a storage modulus in a range of about 10.0 MPa to about 50.0 MPa at a temperature of 25° C. and a frequency of 500 Hz. In detail, the cushion layer 70 may have a storage modulus in a range of about 15.0 MPa to about 30.0 MPa at a temperature of 25° C. and a frequency of 500 Hz. In more detail, the cushion layer 70 may have a storage modulus in a range of about 19.1 MPa to about 19.7 MPa at a temperature of 25° C. and a frequency of 500 Hz. In more detail, the cushion layer 70 may have a storage modulus in a range of about 19.16 MPa to about 19.61 MPa, in a range of about 19.1 MPa to about 19.3 MPa, in a range of about 19.2 MPa to about 19.7 MPa, in a range of about 19.1 MPa to about 19.2 MPa, in a range of about 19.2 MPa to about 19.3 MPa, or in a range of about 19.5 MPa to about 19.7 MPa at a temperature of 25° C. and a frequency of 500 Hz.

Also, the cushion layer 70 may have a tangent delta in a range of about 0.1 to about 0.5 at a temperature of 25° C. and a frequency of 500 Hz. In detail, the cushion layer 70 may have a tangent delta in a range of about 0.25 to about 0.45 at a temperature of 25° C. and a frequency of 500 Hz. In more detail, the cushion layer 70 may have a tangent delta in a range of about 0.31 to about 0.44 at a temperature of 25° C. and a frequency of 500 Hz. In more detail, the cushion layer 70 may have a tangent delta in a range of about 0.306 to about 0.4385, in a range of about 0.25 to about 0.40, about 0.35 to about 0.45, in a range of about 0.25 to about 0.35, in a range of about 0.35 to about 0.40, or in a range of about 0.40 to about 0.45 at a temperature of 25° C. and a frequency of 500 Hz.

In this case, the cushion layer 70 may have a loss modulus in a range of about 1.0 MPa to about 10.0 MPa. In detail, the cushion layer 70 may have a loss modulus in a range of about 4.0 MPa to about 9.0 MPa. In more detail, the cushion layer 70 may have a loss modulus in a range of about 5.8 MPa to about 8.6 MPa. In more detail, the cushion layer 70 may have a loss modulus in a range of about 5.864 MPa to about 8.596 MPa, in a range of about 5.5 MPa to about 7.5 MPa, in a range of about 6.5 MPa to about 9.0 MPa, in a range of about 5.5 MPa to about 6.0 MPa, in a range of about 6.5 MPa to about 7.5 MPa, or in a range of about 8.0 MPa to about 9.0 MPa.

The cushion layer 70 may have a storage modulus in a range of about 10.0 MPa to about 50.0 MPa at a temperature of 25° C. and a frequency of 1000 Hz. In detail, the cushion layer 70 may have a storage modulus in a range of about 23.0 MPa to about 35.0 MPa at a temperature of 25° C. and a frequency of 1000 Hz. In more detail, the cushion layer 70 may have a storage modulus in a range of about 27.9 MPa to about 31.0 MPa at a temperature of 25° C. and a frequency of 1000 Hz. In more detail, the cushion layer 70 may have a storage modulus in a range of about 27.95 MPa to about 30.93 MPa, in a range of about 27.5 MPa to about 30.5 MPa, in a range of about 29.5 MPa to about 31.5 MPa, in a range of about 27.5 MPa to about 28.5 MPa, in a range of about 29.0 MPa to about 30.0 MPa, or in a range of about 30.5 MPa to about 31.5 MPa at a temperature of 25° C. and a frequency of 1000 Hz.

Also, the cushion layer 70 may have a tangent delta in a range of about 0.1 to about 0.5 at a temperature of 25° C. and a frequency of 1000 Hz. In detail, the cushion layer 70 may have a tangent delta in a range of about 0.20 to about 0.45 at a temperature of 25° C. and a frequency of 1000 Hz. In more detail, the cushion layer 70 may have a tangent delta in a range of about 0.26 to about 0.41 at a temperature of 25° C. and a frequency of 1000 Hz. In more detail, the cushion layer 70 may have a tangent delta in a range of about 0.261 to about 0.408, in a range of about 0.25 to about 0.38, about 0.37 to about 0.41, in a range of about 0.25 to about 0.30, in a range of about 0.35 to about 0.40, or in a range of about 0.40 to about 0.45 at a temperature of 25° C. and a frequency of 1000 Hz.

In this case, the cushion layer 70 may have a loss modulus in a range of about 3.0 MPa to about 20.0 MPa. In detail, the cushion layer 70 may have a loss modulus in a range of about 5.0 MPa to about 15.0 MPa. In more detail, the cushion layer 70 may have a loss modulus in a range of about 7.2 MPa to about 12.7 MPa. In more detail, the cushion layer 70 may have a loss modulus in a range of about 7.295 MPa to about 12.62 MPa, in a range of about 7.2 MPa to about 11.2 MPa, in a range of about 11.0 MPa to about 13.0 MPa, in a range of about 7.2 MPa to about 7.4 MPa, in a range of about 11.0 MPa to about 11.3 MPa, or in a range of about 12.5 MPa to about 13.0 MPa.

The cushion layer 70 may have a storage modulus in a range of about 20.0 MPa to about 80.0 MPa at a temperature of 25° C. and a frequency of 2500 Hz. In detail, the cushion layer 70 may have a storage modulus in a range of about 25.0 MPa to about 65.0 MPa at a temperature of 25° C. and a frequency of 2500 Hz. In more detail, the cushion layer 70 may have a storage modulus in a range of about 31.5 MPa to about 57.7 MPa at a temperature of 25° C. and a frequency of 2500 Hz. In more detail, the cushion layer 70 may have a storage modulus in a range of about 31.5 MPa to about 57.63 MPa, in a range of about 30.0 MPa to about 52.0 MPa, in a range of about 45.0 MPa to about 60.0 MPa, in a range of about 30.0 MPa to about 33.0 MPa, in a range of about 48.0 MPa to about 52.0 MPa, or in a range of about 55.5 MPa to about 60.5 MPa at a temperature of 25° C. and a frequency of 2500 Hz.

Also, the cushion layer 70 may have a tangent delta in a range of about 0.1 to about 0.45 at a temperature of 25° C. and a frequency of 2500 Hz. In detail, the cushion layer 70 may have a tangent delta in a range of about 0.20 to about 0.40 at a temperature of 25° C. and a frequency of 2500 Hz. In more detail, the cushion layer 70 may have a tangent delta in a range of about 0.24 to about 0.37 at a temperature of 25° C. and a frequency of 2500 Hz. In more detail, the cushion layer 70 may have a tangent delta in a range of about 0.2479 to about 0.3669, in a range of about 0.23 to about 0.35, in a range of about 0.32 to about 0.38, in a range of about 0.23 to about 0.25, in a range of about 0.32 to about 0.35, or in a range of about 0.35 to about 0.40 at a temperature of 25° C. and a frequency of 2500 Hz.

In this case, the cushion layer 70 may have a loss modulus in a range of about 3.0 MPa to about 25.0 MPa. In detail, the cushion layer 70 may have a loss modulus in a range of about 5.0 MPa to about 20.0 MPa. In more detail, the cushion layer 70 may have a loss modulus in a range of about 7.8 MPa to about 19.2 MPa. In more detail, the cushion layer 70 may has a loss modulus in a range of about 7.81 MPa to about 19.18 MPa, in a range of about 7.5 MPa to about 18.8 MPa, in a range of about 18.0 MPa to about 19.5 MPa, in a range of about 7.5 MPa to about 8.0 MPa, in a range of about 18.0 MPa to about 18.8 MPa, or in a range of about 18.8 MPa to about 19.5 MPa.

When the cushion layer 70 has such ranges of storage modulus, loss modulus, and tangent delta, the cushion layer 70 may be sufficiently soft to absorb an external impact. Accordingly, even when vibration having a frequency of hundreds of Hz to thousands of Hz is applied to the cushion layer 70, the cushion layer 70 absorbs a lot of external impact applied to the display apparatus 1 and only a part of external impact may be transmitted to the display panel 10. Accordingly, the display panel 10 may not be damaged by an external impact. At least one of the first cushion layer C1, the second cushion layer C2, and the third cushion layer C3 may have such ranges of storage modulus, loss modulus, and tangent delta.

In a case where the storage modulus of cushion layer 70 exceeds the above range or the tangent delta of the cushion layer 70 is less than the above range, the cushion layer 70 may be rigid. Accordingly, when vibration having a frequency of hundreds of Hz to thousands of Hz is applied to the cushion layer 70, the cushion layer 70 absorbs less external impact applied to the display apparatus 1 and most of external impact may be transmitted to the display panel 10. Accordingly, the display panel 10 may be easily damaged by an external impact. In a case where the storage modulus of cushion layer 70 is less than the above range or the tangent delta of cushion layer 70 exceeds the above range, the cushion layer 70 may be too soft and unable to maintain a certain shape. Accordingly, the cushion layer 70 may be flabby and difficult to be handled. The fourth cushion layer C4 and fifth cushion layer C5 are unable to have such ranges of storage modulus, loss modulus, and tangent delta.

Table 5 shows results of evaluating impact resistance of display apparatuses according to embodiments. Example 1 is a display apparatus including the first cushion layer C1, Example 2 is a display apparatus including the second cushion layer C2, and Example 3 is a display apparatus including the third cushion layer C3. In other words, Examples 1 through 3 are only different from each other in that the cushion layer 70 of the display apparatus 1 described with reference to FIGS. 1 through 6 is the first cushion layer C1, second cushion layer C2, or third cushion layer C3, and components other than the cushion layer 70 are the same.

For convenience of descriptions, Table 5 also shows results of evaluating impact resistance of display apparatuses according to comparative examples. Comparative Example 1 is a display apparatus including the fourth cushion layer C4 and Comparative Example 2 is a display apparatus including the fifth cushion layer C5. Comparative Examples 1 and 2 are only different from each other in that the cushion layer 70 of the display apparatus 1 described with reference to FIGS. 1 through 6 is the fourth cushion layer C4 or fifth cushion layer C5, and components other than the cushion layer 70 are the same as those according to embodiments.

In detail, Table 5 shows result values of a drop test to evaluate impact resistance. The drop test is performed by freely dropping a same ballpoint pen vertically on the display apparatuses of Examples 1 to 3 and Comparative Examples 1 and 2, and measuring a height at which the display apparatuses are damaged by the ballpoint pen.

TABLE 5

| | Example 1 | Example 2 | Example 3 | Comparative Example 1 | Comparative Example 2 |
|---|---|---|---|---|---|
| Average Height (cm) of Damage | 8.4 | 8.0 | 7.3 | 6.1 | 6.4 |
| Standard Deviation | 0.5 | 0.2 | 0.7 | 0.8 | 0.4 |

Referring to Table 5, Example 1 may have impact resistance to a ballpoint pen dropped at an average height of 8.4 cm. Example 2 may have impact resistance to a ballpoint pen dropped at an average height of 8.0 cm, and Example 3 may have impact resistance to a ballpoint pen dropped at an average height of 7.3 cm. Comparative Example 1 may have impact resistance to a ballpoint pen dropped at an average height of 6.1 cm, and Comparative Example 2 may have impact resistance to a ballpoint pen dropped at an average height of 6.4 cm. In other words, display apparatuses according to embodiments may have improved impact resistance compared to display apparatuses according to comparative examples.

The impact resistance of the display apparatus 1 may be related to the storage modulus, loss modulus, and tangent delta of the cushion layer 70. As described above, the first cushion layer C1, second cushion layer C2, and third cushion layer C3 included in the display apparatuses 1 according to Examples 1 to 3 may have greater storage moduli and smaller tangent deltas than the fourth cushion layer C4 and fifth cushion layer C5 included in the display apparatuses according to Comparative Examples 1 and 2. In this case, the cushion layer 70 absorbs more external impact applied to the display apparatus 1 and only a part of the external impact may be transmitted to the display panel 10.

Accordingly, the first cushion layer C1, second cushion layer C2, and third cushion layer C3 included in the display apparatuses 1 according to Examples 1 to 3 may absorb more external impact than the fourth cushion layer C4 and fifth cushion layer C5 included in the display apparatuses according to Comparative Examples 1 and 2. Thus, less external impact may be transmitted to the display apparatuses 1 according to Examples 1 to 3 than to the display apparatuses according to Comparative Examples 1 and 2. Accordingly, the display apparatuses 1 according to Examples 1 to 3 may have improved impact resistance compared to the display apparatuses according to Comparative Examples 1 and 2.

According to an embodiment as described above, a display apparatus with improved impact resistance may be realized.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:

a display panel including a display element;

a cover window disposed on the display panel;

a first plate arranged below the display panel; and a cushion layer arranged below the first plate, wherein the cushion layer has a storage modulus in a range of about 0.1 MPa to about 10.0 MPa and a tangent delta in a range of about 0.1 to about 0.5, at a temperature of 25° C. and a frequency of 1 Hz.

2. The display apparatus of claim 1, wherein the cushion layer has a loss modulus in a range of about 0.1 MPa to about 5.0 MPa at the temperature of 25° C. and the frequency of 1 Hz.

3. The display apparatus of claim 1, wherein the cushion layer has a storage modulus in a range of about 10.0 MPa to about 400.0 MPa at a temperature of −20° C. and the frequency of 1 Hz.

4. The display apparatus of claim 1, wherein the cushion layer has a tangent delta in a range of about 0.1 to about 0.5 at a temperature of −20° C. and the frequency of 1 Hz.

5. The display apparatus of claim 4, wherein the cushion layer has a loss modulus in a range of about 5.0 MPa to about 80.0 MPa at the temperature of about −20° C. and the frequency of about 1 Hz.

6. The display apparatus of claim 1, wherein the cushion layer has a storage modulus in a range of about 0.5 MPa to about 5.0 MPa at a temperature of 60° C. and the frequency of 1 Hz.

7. The display apparatus of claim 1, wherein the cushion layer has a tangent delta in a range of about 0.1 to about 0.4 at a temperature of 60° C. and the frequency of 1 Hz.

8. The display apparatus of claim 7, wherein the cushion layer has a loss modulus in a range of about 0.1 MPa to about 0.5 MPa at the temperature of 60° C. and the frequency of 1 Hz.

9. The display apparatus of claim 1, wherein the cushion layer has a storage modulus in a range of about 10.0 MPa to about 50.0 MPa at the temperature of 25° C. and a frequency of 500 Hz.

10. The display apparatus of claim 1, wherein the cushion layer has a tangent delta in a range of about 0.1 to about 0.5 at the temperature of 25° C. and a frequency of 500 Hz.

11. The display apparatus of claim 10, wherein the cushion layer has a loss modulus in a range of about 1.0 MPa to about 10.0 MPa at the temperature of 25° C. and the frequency of 500 Hz.

12. The display apparatus of claim 1, wherein the cushion layer has a storage modulus in a range of about 10.0 MPa to about 50.0 MPa at the temperature of 25° C. and a frequency of 1000 Hz.

13. The display apparatus of claim 1, wherein the cushion layer has a tangent delta in a range of about 0.1 to about 0.5 at the temperature of 25° C. and a frequency of 1000 Hz.

14. The display apparatus of claim 13, wherein the cushion layer has a loss modulus in a range of about 3.0 MPa to about 20.0 MPa at the temperature of 25° C. and the frequency of 1000 Hz.

15. The display apparatus of claim 1, wherein the cushion layer has a storage modulus in a range of about 20.0 MPa to about 80.0 MPa at the temperature of 25° C. and a frequency of 2500 Hz.

16. The display apparatus of claim 1, wherein the cushion layer has a tangent delta in a range of about 0.1 to about 0.45 at the temperature of 25° C. and a frequency of 2500 Hz.

17. The display apparatus of claim 16, wherein the cushion layer has a loss modulus in a range of about 3.0 MPa to about 25.0 MPa at the temperature of 25° C. and the frequency of 2500 Hz.

18. The display apparatus of claim 1, wherein the cushion layer includes polyurethane or polyacrylate.

19. The display apparatus of claim 1, wherein the first plate includes at least one of metal, glass, and plastic.

20. The display apparatus of claim 1, further comprising:

a first protective layer disposed between the cover window and the display panel;

a second protective layer disposed below the display panel;

a support layer disposed between the second protective layer and the first plate; and a second plate disposed between the first plate and the cushion layer.

* * * * *